US012216973B2

(12) United States Patent
Li et al.

(10) Patent No.: US 12,216,973 B2
(45) Date of Patent: Feb. 4, 2025

(54) METHOD AND SYSTEM FOR AUTOMATIC MACHINE LEARNING-BASED PREDICTION OF NEW ENERGY POWER WITH CLOUD-EDGE COLLABORATION

(71) Applicant: CSG DIGITAL POWER GRID RESEARCH INST. CO., LTD., Guangzhou (CN)

(72) Inventors: Peng Li, Guangzhou (CN); Xiyuan Ma, Guangzhou (CN); Zhuohuan Li, Guangzhou (CN); Changcheng Zhou, Guangzhou (CN); Kai Cheng, Guangzhou (CN); Tao Bao, Guangzhou (CN); Yansen Chen, Guangzhou (CN); Xudong Hu, Guangzhou (CN); Shixian Pan, Guangzhou (CN); Zihao Zhang, Guangzhou (CN); Senjing Yao, Guangzhou (CN); Wei Xi, Guangzhou (CN); Yuanfeng Chen, Guangzhou (CN)

(73) Assignee: CSG DIGITAL POWER GRID RESEARCH INST. CO., LTD., Guangzhou (CN)

( * ) Notice: Subject to any disclaimer, the term of this patent is extended or adjusted under 35 U.S.C. 154(b) by 0 days.

(21) Appl. No.: 18/636,790

(22) Filed: Apr. 16, 2024

(65) Prior Publication Data
US 2024/0394443 A1    Nov. 28, 2024

(30) Foreign Application Priority Data

May 16, 2023  (CN) .......................... 202310548550.6

(51) Int. Cl.
*G06F 30/27*    (2020.01)
(52) U.S. Cl.
CPC .................. *G06F 30/27* (2020.01)

(58) Field of Classification Search
CPC ...................................................... G06F 30/27
See application file for complete search history.

(56) References Cited

U.S. PATENT DOCUMENTS 9,921,339 B2 * 3/2018 Menicucci .............. G01W 1/10
10,041,475 B1 * 8/2018 Badrinath Krishna .....................
F03D 7/047
(Continued)

FOREIGN PATENT DOCUMENTS

CN       111915053 A    11/2020
CN       114462722 A     5/2022
(Continued)

OTHER PUBLICATIONS

M. Ashraf, B. Raza, M. Arshad, A. Ahmed and S. S. H. Zaidi, "A Hybrid Statistical Model for Ultra Short Term Wind Speed Prediction," 2023 7th International Multi-Topic ICT Conference (IMTIC), Jamshoro, Pakistan, 2023, pp. 1-8, doi: 10.1109/IMTIC58887.2023. 10178567. (Year: 2023).*
(Continued)

*Primary Examiner* — Charles L Beard
(74) *Attorney, Agent, or Firm* — Taft Stettinius & Hollister LLP

(57) ABSTRACT

A method and a system for automatic machine learning-based prediction of new energy power with cloud-edge collaboration are disclosed. The method includes: obtaining, in response to a power prediction demand for a target new energy station, future numerical weather prediction data of the target new energy station in a future period and historical output power of a historical period corresponding to the future period; selecting, based on missing of the future numerical weather prediction data and a data amount of the historical output power, a target power prediction model corresponding to the target new energy station; and adjusting the target power prediction model according to the target (Continued)

working mode, and predicting, by the adjusted target power prediction model, a target output power of the target new energy station in the future period, based on the future numerical weather prediction data and the historical output power.

18 Claims, 16 Drawing Sheets

(56) References Cited

U.S. PATENT DOCUMENTS

| | | | |
|---|---|---|---|
| 10,103,548 B2* | 10/2018 | He | H02S 50/10 |
| 10,418,822 B2* | 9/2019 | Sun | G06Q 10/063 |
| 11,536,249 B2* | 12/2022 | Gebraad | F03D 7/045 |
| 11,651,311 B2* | 5/2023 | Monforte | H02J 13/00022 703/18 |
| 2013/0046492 A1* | 2/2013 | Westergaard | H02J 3/004 702/60 |
| 2014/0195159 A1* | 7/2014 | Mewes | G01R 21/00 702/3 |
| 2015/0095004 A1* | 4/2015 | Kim | F03D 7/048 703/7 |
| 2017/0030333 A1* | 2/2017 | Srivastava | F03D 7/048 |
| 2017/0102725 A1* | 4/2017 | Parvania | H02J 3/00 |
| 2017/0371073 A1* | 12/2017 | Suzuki | G01P 5/00 |
| 2018/0223804 A1* | 8/2018 | Badrinath Krishna | F03D 7/048 |
| 2018/0223812 A1* | 8/2018 | Badrinath Krishna | F03D 7/046 |
| 2018/0223814 A1* | 8/2018 | Badrinath Krishna | G06N 3/04 |
| 2018/0323643 A1* | 11/2018 | Arar | H02J 3/14 |
| 2018/0340515 A1* | 11/2018 | Huyn | F03D 17/00 |
| 2020/0209430 A1* | 7/2020 | Shukla | H02J 3/381 |
| 2020/0327435 A1* | 10/2020 | Wang | G06F 30/18 |
| 2020/0380618 A1* | 12/2020 | Wang | G06F 30/18 |
| 2021/0124854 A1* | 4/2021 | Wang | G06F 30/18 |
| 2021/0182980 A1* | 6/2021 | Rahman | G06Q 30/0204 |
| 2021/0208548 A1* | 7/2021 | Qi | G06Q 50/06 |
| 2021/0303998 A1* | 9/2021 | Manoharan | G06N 3/04 |
| 2021/0374404 A1* | 12/2021 | Zheng | H04Q 9/00 |
| 2021/0405603 A1* | 12/2021 | Nagino | G05B 19/042 |
| 2022/0029424 A1* | 1/2022 | Burra | G05B 19/042 |
| 2022/0082625 A1* | 3/2022 | Kurisawa | G06N 3/08 |
| 2022/0187817 A1* | 6/2022 | Fenstermacher | G06N 7/01 |
| 2022/0190940 A1* | 6/2022 | Zaifman | H04B 17/26 |
| 2022/0260054 A1* | 8/2022 | Vera-Tudela | F03D 7/048 |
| 2022/0283567 A1* | 9/2022 | Mehta | G05B 19/4155 |
| 2022/0283575 A1* | 9/2022 | Mehta | G05B 23/0229 |
| 2022/0284156 A1* | 9/2022 | Zheng | G06F 30/27 |
| 2022/0300679 A1* | 9/2022 | Casey | G06F 30/13 |
| 2022/0316363 A1* | 10/2022 | Hiroe | G05B 23/0289 |
| 2022/0343230 A1* | 10/2022 | Casey | G06F 30/18 |
| 2022/0344934 A1* | 10/2022 | Jayan | G06Q 50/06 |
| 2022/0352714 A1* | 11/2022 | Yim | G06N 20/00 |
| 2022/0414446 A1* | 12/2022 | Mimaroglu | H02J 3/003 |
| 2023/0059990 A1* | 2/2023 | Reddy | H02J 3/003 |
| 2023/0064472 A1* | 3/2023 | Endel | G05B 19/4183 |
| 2023/0080737 A1* | 3/2023 | Fang | G06N 3/044 706/12 |
| 2023/0103959 A1* | 4/2023 | Pavlovski | G01W 1/10 702/3 |
| 2023/0129742 A1* | 4/2023 | Yamasaki | H02J 3/00 705/37 |
| 2023/0155387 A1* | 5/2023 | Farrokhabadi | H02J 3/004 700/287 |
| 2023/0214703 A1* | 7/2023 | Maheswari | G06N 3/088 700/291 |
| 2023/0299580 A1* | 9/2023 | Keerthisinghe | H02J 3/004 700/286 |
| 2023/0347778 A1* | 11/2023 | Shahriar | B60L 58/12 |
| 2023/0350366 A1* | 11/2023 | Suh | G05B 19/042 |
| 2023/0359705 A1* | 11/2023 | Vazquez-Canteli | G06F 18/25 |
| 2023/0369855 A1* | 11/2023 | Shao | G16H 50/30 |
| 2023/0378756 A1* | 11/2023 | Ijaz | H02J 3/32 |
| 2024/0054267 A1* | 2/2024 | Qvist | G06F 30/27 |
| 2024/0133361 A1* | 4/2024 | Alletto | F03D 7/0292 |
| 2024/0143854 A1* | 5/2024 | Mehta | G06F 30/13 |
| 2024/0170986 A1* | 5/2024 | Manikfan | H02J 7/0048 |
| 2024/0195175 A1* | 6/2024 | Shahriar | H02J 3/32 |
| 2024/0202825 A1* | 6/2024 | Ko | G06Q 50/06 |

FOREIGN PATENT DOCUMENTS

| | | |
|---|---|---|
| CN | 114492922 A | 5/2022 |
| CN | 114611799 A | 6/2022 |
| CN | 115358060 A | 11/2022 |
| CN | 115660233 A | 1/2023 |
| JP | 2009225550 A | 10/2009 |

OTHER PUBLICATIONS

Y. Zeng, J. Li, Y. Gao and B. Qian, "Wind Power Prediction Based on GA-optimized BP Neural Network," 2023 2nd International Conference on Advanced Electronics, Electrical and Green Energy (AEEGE), Singapore, Singapore, 2023, pp. 110-114, doi: 10.1109/AEEGE58828.2023.00028. (Year: 2023).*

B. Saad, A. E. Hannani, R. Errattahi and A. Aqqal, "Assessing the Impact of Weather Forecast Models Combination on the AMS Solar Energy Prediction," 2020 Fourth International Conference On Intelligent Computing in Data Sciences (ICDS), Fez, Morocco, 2020, pp. 1-5, doi: 10.1109/ICDS50568.2020.9268767. (Year: 2020).*

S. Jaidee and W. Pora, "Very Short-Term Solar Power Forecast using Data from NWP Model," 2019 4th International Conference on Information Technology (InCIT), Bangkok, Thailand, 2019, pp. 44-49, doi: 10.1109/INCIT.2019.8912012. (Year: 2019).*

W. Cui, C. Wan and Y. Song, "Hybrid Probabilistic Forecasting of Photovoltaic Power Generation Considering Weather Conditions," 2022 IEEE Power & Energy Society General Meeting (PESGM), Denver, CO, USA, 2022, pp. 1-5, doi: 10.1109/PESGM48719.2022.9917228. (Year: 2022).*

L. Dong, F. Song, X. Zhang, D. Xiong and Y. Du, "Research and application of wind farm power prediction method based on meteorological data characteristics and similar scenarios," 2022 4th International Academic Exchange Conference on Science and Technology Innovation (IAECST), Guangzhou, pp. 328-332 (Year: 2022).*

T. N. Da et al., "Short-term Solar Power Prediction using Long Short-Term Memory in Solar Plant with Deep Learning Machine," 2022 6th International Conference on Green Technology and Sustainable Development (GTSD), Nha Trang City, Vietnam, 2022, pp. 651-656 (Year: 2022).*

M. Khalid and A. V. Savkin, "A Method for Short-Term Wind Power Prediction With Multiple Observation Points, " in IEEE Transactions on Power Systems, vol. 27, No. 2, pp. 579-586, May 2012, doi: 10.1109/TPWRS.2011.2160295. (Year: 2012).*

V. Shakirov, N. Tomin and V. Kurbatsky, "Distributed Siting of Wind Farms to Minimize Fluctuations in Generated Power," 2021 17th Conference on Electrical Machines, Drives and Power Systems (ELMA), Sofia, Bulgaria, 2021, pp. 1-5, doi: 10.1109/ELMA52514.2021.9503045. (Year: 2021).*

Chinese Notification to Grant and Search Report for corresponding CN Application No. 202310548550.6, dated Jun. 30, 2023, 4 pages.

Liu et al.; Industrial Control Network Intrusion Detection Based on Hyperparameter Automatic Optimization; 2021; 8 pages.

* cited by examiner

METHOD AND SYSTEM FOR AUTOMATIC MACHINE LEARNING-BASED PREDICTION OF NEW ENERGY POWER WITH CLOUD-EDGE COLLABORATION

CROSS-REFERENCE TO RELATED APPLICATIONS

The present application claims priority to Chinese patent application No. 2023105485506, filed on May 16, 2023, the entire content of which is incorporated herein by reference.

TECHNICAL FIELD

The present disclosure relates to the field of electric power technology, and in particular, to a method and a system for automatic machine learning-based prediction of new energy power with cloud-edge collaboration.

BACKGROUND

How to effectively improve accuracy of prediction of new energy power generation, reduce the construction, operation and maintenance costs of a new energy power prediction system, and improve the reliability of new energy power prediction are technical problems that have long troubled experts and scholars all over the world.

In conventional technology, a mode of independently configuring the prediction system for each new energy station and reporting to the dispatching institution is mainly adopted, so an initial investment cost of independent configuration of a single station remains high. In terms of prediction technology, the present technology is relatively outdated in terms of massive new energy data processing, feature screening, model generalization and framework prediction, resulting in low prediction accuracy. At the same time, numerical weather prediction data (hereinafter it is referred to as NWP), new energy power and other data are often missing or interrupted. The above objectively existing engineering and technical problems have brought huge challenges to improving prediction accuracy.

In conventional new energy power prediction systems, differences in new energy output power affected by terrain, climate, stations, etc. are rarely considered. Unified models and model parameters are used to model various stations, so the model adaptability is poor and the overall prediction accuracy is lower.

SUMMARY

In a first aspect, the present disclosure provides a method for automatic machine learning-based prediction of new energy power with cloud-edge collaboration, which is executed by the edge server. The method includes: obtaining, in response to a power prediction demand for a target new energy station, future numerical weather prediction data of the target new energy station in a future period and historical output power of a historical period corresponding to the future period; selecting, based on missing of the future numerical weather prediction data and a data amount of the historical output power, a target power prediction model corresponding to the target new energy station from the set of power prediction models, each optional power prediction model in the set of power prediction models being trained and delivered by a cloud server based on an automatic machine learning algorithm; determining, based on the power prediction demand, a target working mode of the target power prediction model, the target working mode including a prediction business object, a prediction type, and a prediction time scale; and adjusting the target power prediction model according to the target working mode, and predicting, by the adjusted target power prediction model, a target output power of the target new energy station in the future period, based on the future numerical weather prediction data of the future period and the historical output power of the historical period corresponding to the future period.

In an embodiment, selecting, based on the missing of future numerical weather prediction data and the data amount of the historical output power, the target power prediction model corresponding to the target new energy station from the set of power prediction models includes: determining, when the target new energy station is identified as a non-newly built station or non-expanded station based on the data amount of the historical output power, a data missing level of the future numerical weather prediction data based on the missing of future numerical weather prediction data; and selecting, based on the data missing level, the target power prediction model from the optional power prediction models pertaining to the target new energy station in the set of power prediction models.

In an embodiment, selecting, based on the missing of future numerical weather prediction data and the data amount of the historical output power, the target power prediction model corresponding to the target new energy station from the set of power prediction models includes: determining, when the target new energy station is identified as a newly built station or a newly expanded station based on the data amount of the historical output power, a data missing level of future numerical weather prediction data based on the missing of the future numerical weather prediction data; selecting, based on basic information of the target new energy station, a similar station whose similarity to the target new energy station reaches a similarity threshold from other new energy stations based on basic information of the target new energy station, the other new energy stations being stations in a set of stations except the target new energy station; and selecting, based on the data missing level, the target power prediction model corresponding to the target new energy station from the optional power prediction models pertaining to the similar station in the set of power prediction models.

In an embodiment, predicting, by the adjusted target power prediction model, the target output power of the target new energy station in the future period, based on the future numerical weather prediction data of the future period and the historical output power of the historical period corresponding to the future period includes: complementing, if the data missing level is a scattered missing level, missing data in the future numerical weather prediction data, and predicting, by the adjusted target power prediction model, the target working mode of the power prediction model corresponding to the target new energy station, based on the historical output power and the complemented future numerical weather prediction data; and predicting, by the adjusted target power prediction model, the target output power of the target new energy station in the future period, based on the historical output power, if the data missing level is a continuous missing level.

In an embodiment, selecting, based on the basic information of the target new energy station, the similar station whose similarity to the target new energy station reaches a similarity threshold from other new energy stations includes: obtaining the basic information of the target new energy station and the basic information of each of the other new energy stations, the basic information including at least one dimension data selected from a group consisting of longitude and latitude data, capacity data, terrain data, landform data and altitude data; determining, based on the basic information of the target new energy station and the basic information of each of the other new energy stations, a value of similarity between the target new energy station and each of the other new energy stations in each dimension data; and selecting, based on the value of similarity between the target new energy station and each of the other new energy stations in each dimension data, the similar station whose similarity to the target new energy station reaches the similarity threshold from the other new energy stations.

In an embodiment, predicting, by the adjusted target power prediction model, the target output power of the target new energy station in the future period, based on the future numerical weather prediction data of the future period and the historical output power of the historical period corresponding to the future period includes: obtaining, if a station type is a distributed new energy source, a grid position of the target new energy station; and predicting, by the adjusted target power prediction model, the target output power of the target new energy station in the future period, based on the historical output power and the future numerical weather prediction data corresponding to the grid position.

In a second aspect, the present disclosure provides a method for automatic machine learning-based prediction of new energy power with cloud-edge collaboration, which is executed by the cloud server. The method includes: training, for each new energy station in the set of stations, each initial model based on a training sample set corresponding to a new energy station, and selecting an optional power prediction model corresponding to the new energy station from trained initial models, the training sample set including sample weather prediction data and sample output power, and different initial models being constructed based on different algorithms; constructing, based on the optional power prediction model corresponding to each new energy station, a set of power prediction models, the set of power prediction models being configured for an edge server to: select a target power prediction model corresponding to the target new energy station, based on missing of future numerical weather prediction data of the target new energy station in the future period and amount of the historical output power data of the target new energy station in the historical period corresponding to the future period; and adjust the target power prediction model in the target working mode, and predict, by the adjusted target power prediction model, the target output power of the target new energy station in the future period based on future numerical weather prediction data and the historical output power; and delivering the set of power prediction models to the edge server.

In an embodiment, training each initial model based on the training sample set corresponding to the new energy station includes: performing data mining processing on original weather data in original data corresponding to the new energy station to obtain the sample weather prediction data in the training sample set; performing multi-stage noise reduction processing on original output power in the original data to obtain the sample output power in the training sample set; and training each initial model based on the training sample set.

In an embodiment, performing the data mining processing on the original weather data in the original data corresponding to the new energy station to obtain the sample weather prediction data in the training sample set includes: performing data cleaning on the original weather data in the original data based on a slicing technology; performing correlation analysis on the original output power and the cleaned original weather data to determine a principal component feature set in the original weather data; validating validity of the principal component feature set to obtain a valid feature set; and using the valid feature set as the sample weather prediction data in the training sample set.

In an embodiment, training each initial model based on the training sample set corresponding to the new energy station includes: obtaining, for any initial model, a hyperparameter initial space and an initial step length corresponding to the initial model; adjusting the initial step length based on the number of iterations; searching for a hyperparameter optimization space within the hyperparameter initial space, based on the adjusted step length; obtaining, based on a hyperparameter initial value and a Bayesian optimization algorithm, at least one optimized hyperparameter to be validated within the hyperparameter optimization space; and performing, based on the training sample set corresponding to the new energy station and each optimized hyperparameter to be validated, k-fold cross validation on the initial model to complete the training of the initial model.

In an embodiment, selecting the optional power prediction model corresponding to the station from trained initial models includes: inputting a validation sample set corresponding to the new energy station into each trained initial model, to obtain a validated output power output by each trained initial model; determining, based on an actual output power corresponding to a validation sample in the validation sample set and the validated output power output by each trained initial model, a prediction accuracy of each trained initial model; and selecting, based on the prediction accuracy, the optional power prediction model corresponding to the new energy station from trained initial models.

In a third aspect, the present disclosure also provides a device for automatic machine learning-based prediction of new energy power with cloud-edge collaboration. The device includes a response module, a selection module, an adjustment module, and a prediction module.

The response module is configured to obtain, in respond to a power prediction demand for a target new energy station, future numerical weather prediction data of the target new energy station in a future period and historical output power of a historical period corresponding to the future period.

The selection module is configured to select, based on missing of the future numerical weather prediction data and a data amount of the historical output power, a target power prediction model corresponding to the target new energy station from a set of power prediction models. Each optional power prediction model in the set of power prediction models is trained and delivered by a cloud server based on an automatic machine learning algorithm.

The adjustment module is configured to determine a target working mode of the target power prediction model based on the power prediction demand. The target working mode includes a prediction business object, a prediction type, and a prediction time scale.

The prediction module is configured to adjust the target power prediction model according to the target working mode. The prediction module is further configured to predict, by the adjusted target power prediction model, the target output power of the target new energy station in the future period, based on the future numerical weather prediction data of the future period and the historical output power of the historical period corresponding to the future period.

In a fourth aspect, the present disclosure also provides a device for automatic machine learning-based prediction of new energy power with cloud-edge collaboration. The device includes a training module, a constructing module, and a delivery module.

The training module is configured to train each initial model based on a training sample set corresponding to a new energy station for each new energy station in the set of stations. The training module is further configured to select an optional power prediction model corresponding to the new energy station, from trained initial models. The training sample set includes sample weather prediction data and sample output power, and different initial models are constructed based on different algorithms;

The constructing module is configured to construct a set of power prediction models based on the optional power prediction model corresponding to each new energy station. The set of power prediction models is configured for an edge server to: select a target power prediction model corresponding to the target new energy station, based on missing of future numerical weather prediction data of the target new energy station in the future period and a data amount of the historical output power of the target new energy station in the historical period corresponding to the future period; and adjust the target power prediction model in the target working mode, and predict, by the adjusted target power prediction model, the target output power of the target new energy station in the future period based on the future weather prediction data and the historical output power.

The delivery module is configured to deliver the set of power prediction models to the edge server.

In a fifth aspect, the present disclosure also provides a computer device. The computer device includes a memory and a processor. The memory stores a computer program. When the processor executes the computer program, it implements steps of obtaining, in response to a power prediction demand for a target new energy station, future numerical weather prediction data of the target new energy station in a future period and historical output power of a historical period corresponding to the future period; selecting, based on missing of the future numerical weather prediction data and a data amount of the historical output power, a target power prediction model corresponding to the target new energy station from the set of power prediction models, each optional power prediction model in the set of power prediction models being trained and delivered by a cloud server based on an automatic machine learning algorithm; determining, based on the power prediction demand, a target working mode of the target power prediction model, the target working mode including a prediction business object, a prediction type, and a prediction time scale; and adjusting the target power prediction model according to the target working mode, and predicting, by the adjusted target power prediction model, a target output power of the target new energy station in the future period, based on the future numerical weather prediction data of the future period and the historical output power of the historical period corresponding to the future period.

In a sixth aspect, the present disclosure also provides a computer-readable storage medium, which has a computer program stored thereon. The computer program, when executed by a processor, causes the processor to implement steps of: obtaining, in response to a power prediction demand for a target new energy station, future numerical weather prediction data of the target new energy station in a future period and the historical output power of the historical period corresponding to the future period; selecting, based on missing of the future numerical weather prediction data and a data amount of the historical output power, a target power prediction model corresponding to the target new energy station from the set of power prediction models, each optional power prediction model in the set of power prediction models being trained and delivered by a cloud server based on an automatic machine learning algorithm; determining, based on the power prediction demand, a target working mode of the target power prediction mode, the target working mode including a prediction business object, a prediction type, and a prediction time scale; and adjusting the target power prediction model according to the target working mode, and predicting, by the adjusted target power prediction model, a target output power of the target new energy station in the future period, based on the future numerical weather prediction data of the future period and the historical output power of the historical period corresponding to the future period.

In a seventh aspect, the present disclosure also provides a computer device. The computer device includes a memory and a processor. The memory stores a computer program. When the processor executes the computer program, it implements steps of: training, for each new energy station in the set of stations, each initial model based on a training sample set corresponding to a new energy station, and selecting an optional power prediction model corresponding to the new energy station from trained initial models, the training sample set including sample weather prediction data and sample output power, and different initial models being constructed based on different algorithms; constructing, based on the optional power prediction model corresponding to each new energy station, a set of power prediction models, the set of power prediction models being configured for an edge server to: select a target power prediction model corresponding to the target new energy station, based on missing of future numerical weather prediction data of the target new energy station in the future period and a data amount of the historical output power data of the target new energy station in the historical period corresponding to the future period; and adjust the target power prediction model in the target working mode, and predict, by the adjusted target power prediction model, a target output power of the target new energy station in the future period based on future weather prediction data and the historical output power; and delivering the set of power prediction models to the edge server.

In an eighth aspect, the present disclosure also provides a computer-readable storage medium, which has a computer program stored thereon. The computer program, when executed by a processor, causes the processor to implement steps of training, for each new energy station in the set of stations, each initial model based on a training sample set corresponding to a new energy station, and selecting an optional power prediction model corresponding to the new energy station from trained initial models, the training sample set including sample weather prediction data and sample output power, and different initial models being constructed based on different algorithms; constructing, based on the optional power prediction model corresponding to each new energy station, a set of power prediction models, the set of power prediction models being configured for an edge server to: select a target power prediction model corresponding to the target new energy station, based on missing of future numerical weather prediction data of the target new energy station in the future period and a data amount of the historical output power data of the target new energy station in the historical period corresponding to the future period; and adjust the target power prediction model in the target working mode, and predict, by the adjusted target power prediction model, a target output power of the target new energy station in the future period based on future weather prediction data and the historical output power; and delivering the set of power prediction models to the edge server.

In a ninth aspect, the present disclosure also provides a system for automatic machine learning-based prediction of new energy power with cloud-edge collaboration. The system includes a cloud server and an edge server.

The cloud server is configured to: train, for each new energy station in a set of stations, each initial model based on a training sample set corresponding to the new energy station; select an optional power prediction model corresponding to the new energy station, from the trained initial models, the training sample set including sample weather prediction data and sample output power, and different initial models being constructed based on different algorithms; construct a set of power prediction models based on the optional power prediction model corresponding to each new energy station; and deliver the set of power prediction models to the edge server.

The edge server is configured to receive the set of power prediction models; obtain, in response to a power prediction demand for a target new energy station, future numerical weather prediction data of the target new energy station in a future period and historical output power of a historical period corresponding to the future period; select, based on missing of the future numerical weather prediction data and a data amount of the historical output power, a target power prediction model corresponding to the target new energy station from a set of power prediction models, each optional power prediction model in the set of power prediction models being trained and delivered by the cloud server based on an automatic machine learning algorithm; determine, based on the power prediction demand, a target working mode of the target power prediction model, the target working mode including a prediction business object, a prediction type, and a prediction time scale; and adjust the target power prediction model according to the target working mode, and predict, by the adjusted target power prediction model, the target output power of the target new energy station in the future period based on the future numerical weather prediction data of the future period and the historical output power of the historical period corresponding to the future period.

DETAILED DESCRIPTION OF THE EMBODIMENTS

In order to make the purposes, technical solutions and advantages of the present disclosure more clear, the present disclosure will be further described in detail below with reference to the drawings and embodiments. It should be understood that the specific embodiments described here are only used to explain the present disclosure and are not used to limit the present disclosure.

Figure 1:
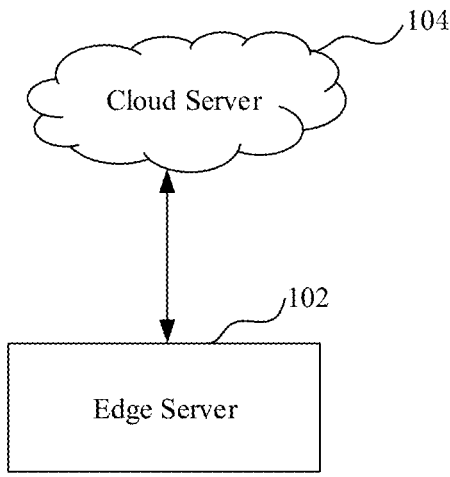
FIG. 1 is a diagram illustrating an application environment of a method for automatic machine learning-based prediction of new energy power with cloud-edge collaboration in an embodiment.

As shown in FIG. 1, this embodiment provides a system for automatic machine learning-based prediction of new energy power with cloud-edge collaboration, including a cloud server 104 and an edge server 102. The edge server 102 communicates with the cloud server 104.

Figure 2:
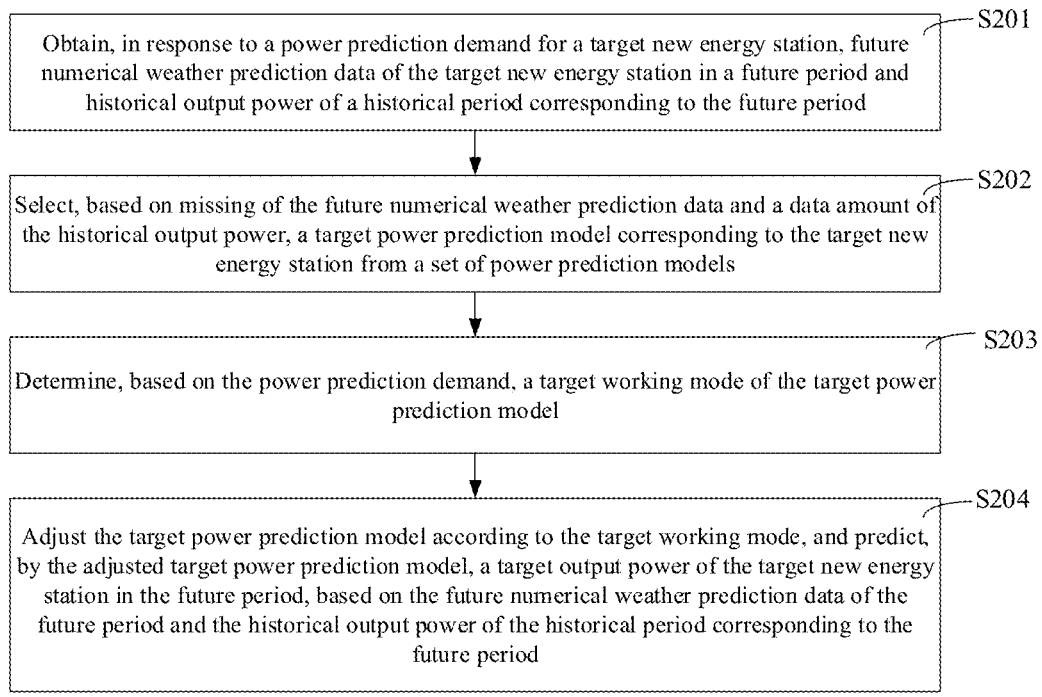
FIG. 2 is a schematic flow diagram of the method for automatic machine learning-based prediction of new energy power with cloud-edge collaboration in an embodiment.

In an embodiment, as shown in FIG. 2, a method for automatic machine learning-based prediction of new energy power with cloud-edge collaboration is provided. The method is described below by taking the method applied to the edge server 102 in FIG. 1 as an example. The method includes the following steps.

In step S201, in response to a power prediction demand for a target new energy station, future numerical weather prediction data of the target new energy station in a future period and historical output power of a historical period corresponding to the future period are obtained.

The power prediction demand carries station information of the target new energy station, such as the number, longitude and latitude, station capacity, terrain, landform, altitude and other characteristics of the target new energy station. It can be understood that the target new energy station may be a new energy main station or a new energy substation in the new energy system. It can be understood that the new energy main station is a dispatching main station of a dispatching center, which is used to dispatch each new energy substation.

The future numerical weather prediction data is the numerical weather prediction (NWP) in the future period. The future numerical weather prediction data may be indicators related to a natural environment in the area where the target new energy station is located. These indicators may include at least one of temperature, cloud cover, shortwave radiation, longwave radiation, surface air pressure, large-scale precipitation, convective precipitation, or humidity.

For example, when the future period is X3 (day)/XX (month)/XXXX (year) [09:00-13:00], and accordingly, the historical output power of the historical period corresponding to the future period includes the historical output power on X0/XX/XXXX [09:00-13:00], the historical output power on X1/XX/XXXX [09:00-13:00], and the historical output power on X2/XX/XXXX [09:00-13:00]. The others can be done in the same manner.

In step S202, a target power prediction model corresponding to the target new energy station is selected from the set of power prediction models based on missing of the future numerical weather prediction data and a data amount of the historical output power.

Each optional power prediction model in the set of power prediction models is automatically trained and automatically delivered by the cloud server 104 based on an automatic machine learning algorithm.

It can be understood that in the set of power prediction models, each new energy station corresponds to at least one optional power prediction model. The optional power prediction model can be in the form of a physical model, a neural network model, a deep learning model, etc., and each optional power prediction model corresponding to the new energy station can be constructed based on different algorithms. Correspondingly, different algorithms can correspond to different training samples.

In an implementation, the optional power prediction model is constructed based on a plurality of groups of {weather prediction data, historical output power} corresponding to the new energy station. In another implementation, the optional power prediction model is constructed based on a plurality of pieces of {historical output powers} corresponding to the new energy station. The output results of the optional power prediction models constructed in the above two ways are both the predicted output power of the station.

The data amount of the historical output power is used to determine whether the new energy station is a newly built station or a newly expanded station. It can be understood that if the data amount of the historical output power of the new energy station is relatively small, the historical output power is not enough to construct an optional power prediction model corresponding to the new energy station. In this case, when the target power prediction model corresponding to the new energy station is selected, a transfer learning mode is entered. In the transfer learning mode, the target power prediction model corresponding to the target new energy station can be selected from the optional predictive power models corresponding to other new energy stations.

The missing of the future numerical weather prediction data is used to determine whether the currently obtained future numerical weather prediction data can support the optional power prediction model to perform a normal prediction task. It can be understood that if it cannot be supported, an intelligent spare tire mode is entered when the target power prediction model is selected. In the intelligent spare tire mode, based on the missing of the future numerical weather prediction data, the target power prediction model corresponding to the target new energy station that can cope with the missing of the corresponding data, is selected from the different optional predictive power models corresponding to the target new energy station.

For example, after being divided according to type and level, the optional predictive power models corresponding to the target new energy station may include at least the following five types: optimal model A1 (its input includes weather prediction data and historical output power data), sub-optimal model B1 (its input includes the weather prediction data and the historical output power data), optimal model A2 (its input only includes the weather prediction data, excluding the historical output power), sub-optimal model B2 (its input only includes the weather prediction data, excluding the historical output power), and no NWP model (its input only includes the historical output power data, excluding weather prediction data). The sub-optimal model B1 and the optimal model A1 can be constructed based on different algorithms, and the optimal model A2 and the sub-optimal model B2 can also be constructed based on different algorithms. Specifically, the intelligent spare tire mode provides a multiple back-up prediction mechanism, taking the missing of the future numerical weather prediction data as a selection basis to determine whether to select the optimal model A1, sub-optimal model B1, optimal model A2, sub-optimal model B2, or no NWP model as the target power prediction model corresponding to the target new energy station, to perform power prediction even when there are interruptions in the historical output power or when there is no NWP.

Further, if there is missing of future numerical weather prediction data and the data amount of the historical output power indicates that the target station is a non-newly built station or a non-expanded station, then a normal prediction mode is entered. In the normal prediction mode, the target power prediction model corresponding to the target new energy station is selected from the optional predictive power models corresponding to the target new energy station, for example, the optimal model A1 and the sub-optimal model B1 in the above example.

Optionally, each optional power prediction model in the set of power prediction models may be delivered to edge server 102 in advance, or may be delivered to edge server 102 only in response to the power prediction demand of the target new energy station. Then, the target power prediction model corresponding to the new energy station is selected from the set of power prediction models in the edge server 102 when power prediction is performed on each new energy station in the set of the stations, to achieve accurate matching between stations and models and provide a more accurate prediction model for the power prediction of the new energy station.

In step S203, a target working mode of the target power prediction model is determined based on the power prediction demand.

The target working mode includes a prediction business object, a prediction type, and a prediction time scale. The prediction business object refers to whether the station type that performs the prediction task is a new energy substation, a new energy main station or a distributed new energy source. The distributed new energy source refers to small wind power or photovoltaic power sources scattered at or near the user site. The prediction type refers to the type of the prediction business object, for example, wind power prediction or photovoltaic power prediction. The prediction time scale includes a short-term time scale, an ultra-short-term time scale, a small time scale, a medium-term time scale, a long-term time scale and other prediction time scales.

It can be understood that in conventional technology, the prediction time scale of new energy is generally 15 minutes. However, from the perspective of reliable power supply for power system operation, if the prediction time scale can be further reduced, for example to the 5 minutes, the reliability of system power supply can be further improved. In this embodiment, the ultra-short-term power prediction time scale is reduced from 15 minutes to a small time scale of 5 minutes by using integrated learning and cloud tracking technology, based on massive spatio-temporal data driving and meteorological feature tracking, to realize 5-minute ultra-short-term fine-grained power prediction.

Further, the target working mode may also include output result types of the models. For example, the output result type may include point prediction, interval prediction and probability prediction. The interval prediction and probability prediction are based on the results of the point prediction. Interval prediction results and probabilistic prediction results are generated by interval estimation and probabilistic estimation methods.

Specifically, after selecting the target power prediction model corresponding to the target new energy station from the set of power prediction models based on the missing of the future numerical weather prediction data and the data amount of the historical output power, the power prediction demand is analyzed, and the target working mode of the target power prediction model is selected from candidate working modes obtained by combining the prediction business object, the prediction type, and the prediction time scale.

Figure 3:
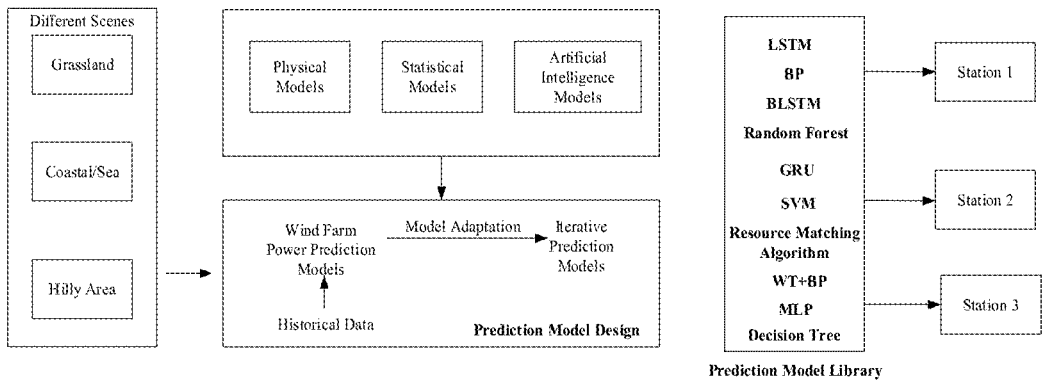
FIG. 3 is a schematic diagram of matching corresponding prediction models for stations in different scenes in an embodiment.

The distribution locations of the stations are different, so there will be different prediction models corresponding to the new energy stations in different scenes in the set of power prediction models (prediction model library). As shown in FIG. 3. In the design stage of the prediction model, new energy stations in different scenes are designed to obtain their corresponding models based on the unified prediction model design process. The model developed and designed in the prediction model design process may be a physical model, a statistical model, an artificial intelligence model or other types. During the design process, the suitability of the above-mentioned different types of models (i.e. physical models, statistical models or artificial intelligence models) and different scenes (i.e. the prediction accuracy reaches the corresponding accuracy threshold) is determined respectively, to obtain a plurality of iterative prediction models corresponding to the scenes. Then, a prediction model library is formed based on the plurality of iterative prediction models corresponding to the scenes. For example, each iterative prediction model in the prediction model library may be formed based on a long short-term memory (LSTM) network, back propagation (BP), random forest, resource matching algorithm, etc. It can be understood that when the prediction model corresponding to any station is determined, the iterative prediction model with the highest prediction accuracy for the station can be selected from the prediction model library.

In step S204, the target power prediction model is adjusted according to the target working mode. A target output power of the target new energy station in the future period is predicted by the adjusted target power prediction model, based on the future numerical weather prediction data of the future period and the historical output power of the historical period corresponding to the future period.

After adjusting the working mode of the target power prediction model to the target working mode, the future numerical weather prediction data and the historical output power are input into the target power prediction model, to obtain the target output power for the future period output by the target power prediction model.

For example, if the target power prediction model is the above-mentioned optimal model A1 or sub-optimal model B1, then {the future numerical weather prediction data, the historical output power} is input into the target power prediction model. If the target power prediction model is the above-mentioned optimal model A2 or the sub-optimal model B2, then {the future numerical weather prediction data} is input into the target power prediction model. If the target power prediction model is the above-mentioned non-NWP model, then {historical output power} is input into the target power prediction model to obtain the corresponding target output power.

According to the above-mentioned method for automatic machine learning-based prediction of new energy power with cloud-edge collaboration, in the new energy system, the usage status of each station (reflected by the data amount of the historical output power) is different, and the missing of the future numerical weather prediction data used in the power prediction performed by the same station in different time periods is also different. In conventional technology, a unified power prediction model is used, which cannot be adapted to different stations. In the present disclosure, based on the usage status of the station corresponding to the target new energy station, and the missing of the future numerical weather prediction data, the target power prediction model corresponding to the target new energy station can be accurately matched from the set of power prediction models. The target power prediction model can perform power prediction adapted to the missing of corresponding weather prediction data or the usage status of the station, so accurate prediction of the output power of different stations can be achieved. Further, based on the power prediction demand of the target new energy station, the working mode of the target power prediction model is adjusted to obtain the target output power that better meets the prediction demand, resulting in improvement of the accuracy of the power prediction.

In an embodiment, an optional method is provided for adjusting the target power prediction model according to the target working mode, and predicting, by the adjusted target power prediction model, the target output power of the target new energy station in the future period, based on the future numerical weather prediction data of the future period and the historical output power of the historical period corresponding to the future period, i.e., a way to refine the step S104 is provided. The specific implementation process may include following steps. If a station type of the target new energy station is a distributed new energy source, then a grid position of the target new energy station is obtained. The target output power of the target new energy station in the future period is predicted by the adjusted target power prediction model, based on the historical output power and the future numerical weather prediction data corresponding to the grid position.

Each distributed new energy source in the new energy system is arranged according to a mesh structure. Each distributed new energy source corresponds to a grid position. Correspondingly, each grid position corresponds to the future numerical weather prediction data.

In this embodiment, when the station type of the target new energy station is the distributed new energy source, differentiated and refined power prediction can be achieved by matching the future numerical weather prediction data of the grid position where the distributed new energy source is located.

Figure 4:
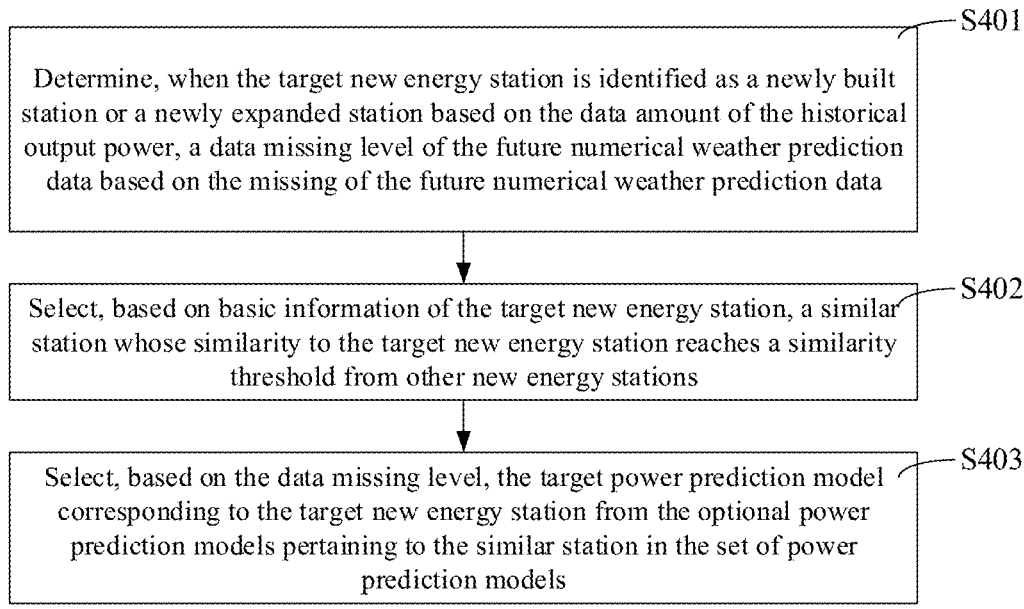
FIG. 4 is a schematic flow diagram of selecting a target power prediction model based on a data missing level when the target station is a newly built station or a newly expanded station in an embodiment.

As shown in FIG. 4, this embodiment provides an optional method for selecting the target power prediction model corresponding to the target new energy station from the set of power prediction models based on the missing of the future numerical weather prediction data and the data amount of the historical output power, i.e., provides a way to refine the step S102. The specific implementation process may include the following steps.

In step S401, when the target new energy station is identified as a newly built station or a newly expanded station based on the data amount of the historical output power, a data missing level of the future numerical weather prediction data is determined based on the missing of the future numerical weather prediction data.

The data missing level may include the scattered missing level and the continuous missing level. Optionally, the scattered missing level corresponds to a short-term interruption (for example, less than or equal to 2 hours), and the continuous missing level may correspond to the continuous missing of NWP data for more than 7 days.

Optionally, if the data amount of the historical output power reaches a construction quantity threshold, the target new energy station is determined to be a non-newly built station or a non-expanded station. It can be understood that optional power prediction model corresponding to the non-newly built station or the non-expanded station has been constructed in the set of power prediction models. If the data amount of the historical output power corresponding to the target new energy station does not reach the construction quantity threshold, the target new energy station is determined to be a newly built station or an expanded station. It can be understood that there is no optional power prediction model corresponding to the newly built station or the expanded station in the set of power prediction models. In this case, the transfer learning mode is entered. In the transfer learning mode, the optional power prediction models corresponding to other new energy stations (non-newly built energy station or non-expanded station) are used as the target power prediction model of the target new energy station to realize the transfer. The other new energy stations are the stations other than the target new energy station in the set of stations.

In step S402, a similar station whose similarity to the target new energy station reaches a similarity threshold is selected from other new energy stations based on basic information of the target new energy station.

Figure 5:
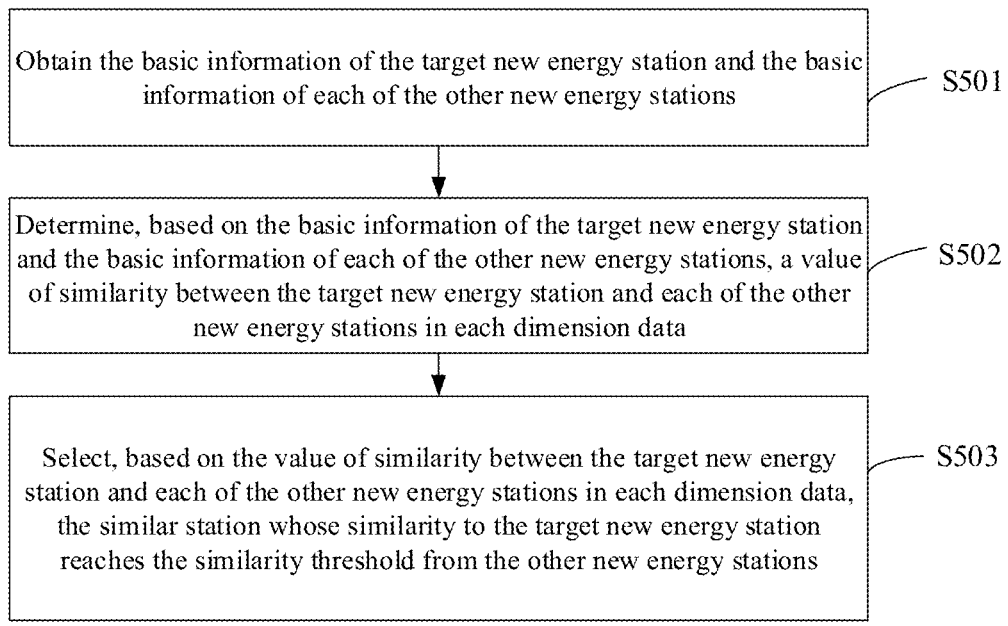
FIG. 5 is a schematic flow diagram of determining a similar station corresponding to a target new energy station in an embodiment.

Optionally, when determining the similar station (i.e., the refinement process of S402), as shown in FIG. 5, the specific process may include the following steps.

In step S501, the basic information of the target new energy station and the basic information of each of the other new energy stations is obtained.

The basic information includes at least one dimension data selected from a group consisting of longitude and latitude data, capacity data, terrain data, landform data, and altitude data.

In step S502, a value of similarity between the target new energy station and each of the other new energy stations in each dimension data is determined based on the basic information of the target new energy station and the basic information of each of the other new energy stations.

Optionally, determining the value of similarity between the target new energy station and each of the other new energy stations in each dimension data including the following processes.

In process Sa, a similarity distance is calculated. The following formulas (1) to (3) are used to standardize the numerical features in the basic information:

$$f_i^* = \frac{f_i - f_{imin}}{f_{imax} - f_{imin}}, i = 1, 2, 3, 4, 5, \tag{1}$$

$$f_{imax} = \max(f_i), \text{ and} \tag{2}$$

$$f_{imin} = \min(f_i), \tag{3}$$

where $f_i$ is the numerical characteristic of the i-th station (the i-th station may be the target new energy station or other new energy stations), $f_{i\,max}$ is the maximum of all $f_i$, and $f_{i\,min}$ is the minimum of all $f_i$.

In step Sb, the following formula (4) is used to calculate a value of similarity between the target new energy station and any other new energy station in each dimension data:

$$dist(x, y_i) = (w_i \cdot |x_l - y_{i1}|^p + + w_n \cdot |x_n - y_{jn}|^p)^{\frac{1}{p}}, \tag{4}$$

where the weight coefficient satisfies $w_i \geq 0$, p refers to the norm identifier, X and $y_i$ refer to the basic information matrices of the target new energy station to be transferred and other new energy stations respectively, $x_n$ refers to the n-th feature of the target new energy station, $y_{jn}$ refers to the n-th feature of the j-th other new energy station in the set of stations, and dist $(x, y_i)$ refers to the value of similarity between the target new energy station and each of the other new energy stations in each dimension data.

In step S503, a similar station is selected from the other new energy stations whose similarity to the target new energy station reaches the similarity threshold based on the value of similarity between the target new energy station and each of the other new energy stations in each dimension data.

Specifically, the value of similarity dist (x, $y_i$) between the target new energy station and each of the other new energy stations is calculated. The station whose dist (x, $y_i$) is greater than the similarity threshold is regarded as the similar station, and there is at least one similar station. For example, in this embodiment, three similar stations are selected, and the optional power prediction models corresponding to the three similar stations are formed into a transfer model library. The transfer model library is transferred to the target new energy station. Since the new energy stations have a unified data type and format in the future numerical weather prediction data and the historical output power, the transfer model library has a high degree of compatibility and adaptability for each station.

In step S403, the target power prediction model corresponding to the target new energy station is selected from the optional power prediction models pertaining to the similar station in the set of power prediction models based on the data missing level.

Specifically, the above-mentioned transfer model library is used to predict the target output power of the target new energy station. When predicting the target output power, the corresponding optimal model A1, sub-optimal model B1, optimal model A2, sub-optimal model B2, or no NWP model is selected as the target power prediction model of the target new energy station from the transfer model library based on the data missing level.

Figure 6:
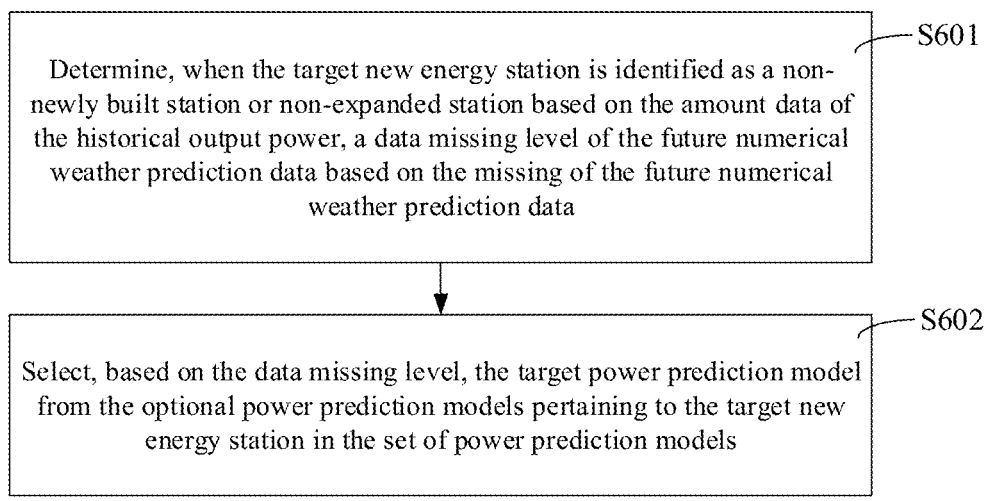
FIG. 6 is a schematic flow diagram of selecting a target power prediction model based on a data missing level when the target station is a non-new station or a non-expanded station in an embodiment.

As shown in FIG. 6, this embodiment provides an optional way for selecting the target power prediction model corresponding to the target new energy station from the set of power prediction models based on the missing of the future numerical weather prediction data and the data amount of the historical output power, that is, provides a way to refine the step S102. The specific implementation process may include the following steps.

In step S601, when the target new energy station is identified as a non-newly built station or non-expanded station based on the data amount of the historical output power, a data missing level of the future numerical weather prediction data is determined based on the missing of future numerical weather prediction data.

It can be understood that if the target new energy station is the non-newly built station or non-expanded station, there is an optional power prediction model corresponding to the non-new station or non-expanded station in the set of power prediction models. Each optional power prediction model includes, for example, the above-mentioned optimal model A1, sub-optimal model B1, optimal model A2, sub-optimal model B2 and no NWP model.

In step S602, the target power prediction model is selected from the optional power prediction models pertaining to the target new energy station in the set of power prediction models based on the data missing level.

In an implementation, if the data missing level is a scattered missing level, missing data in the future numerical weather prediction data is complemented. Based on the adjusted target power prediction model, the historical output power and the complemented future numerical weather prediction data are used to predict the target output power of the target new energy station in the future period. Specifically, if it is detected that the data missing duration of the future numerical weather prediction data is less than a preset interruption period (for example, 2 hours), the data missing level is determined as the scattered missing level.

Figure 7:
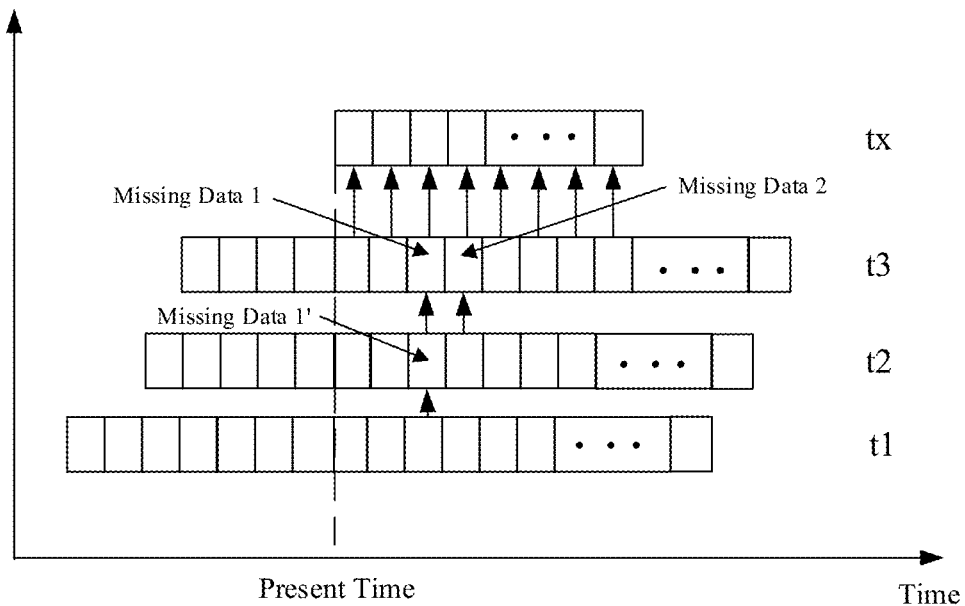
FIG. 7 is a schematic diagram of completing future numerical weather prediction data for a short interruption in an embodiment.

When the missing data in the future numerical weather prediction data is complemented, a neighbor complementing method or intelligent complementing method may be used. The neighbor complementing method includes complementing missing data in the future numerical weather prediction data based on the candidate numerical weather prediction data corresponding to each historical time within the preset time range. As shown in FIG. 7, for example, historical times within the preset time range includes t1 and t2. t1 corresponds to candidate numerical weather prediction data 1, t2 corresponds to candidate numerical weather prediction data 2, and t3 corresponds to the future numerical weather prediction data. When the future numerical weather prediction data corresponding to t3 has missing data 1 and missing data 2, a missing time 1 corresponding to the missing data 1 and a missing time 2 corresponding to the missing data 2 are determined. Then, it is firstly checked whether data corresponding to the missing time 1 is missing in the candidate numerical weather prediction data 1. As shown in FIG. 7, the data corresponding to the missing time 1 in the candidate numerical weather prediction data 1 is the missing data 1', then it is checked whether the data corresponding to the missing time 1 is missing in the candidate numerical weather prediction data 2. As shown in FIG. 7, the data corresponding to the missing time 1 in the candidate numerical weather prediction data 2 is non-missing data, then the non-missing data is complemented to the future numerical weather prediction data. The missing data 2 is processed in the same way as the missing data 1. Finally, the complemented future numerical weather prediction data is obtained, that is, the future numerical weather prediction data corresponding to the tx time.

It can be understood that if the data missing level is a scattered missing level, then from the optional power prediction model belonging to the target new energy station in the set of power prediction models, the target power prediction model whose input data is {historical output power, weather prediction data} is selected, such as the above-mentioned optimal model A1 and sub-optimal model B1. The target output power of the target new energy station in the future period can be predicted based on the complemented future numerical weather prediction data.

In this embodiment, when there is a temporary interruption in the weather prediction data, the weather prediction data is automatically complemented, and the target power prediction model whose input data is {historical output power, weather prediction data} is automatically selected, realizing the automatic handling of temporary data missing.

In another implementation, if the data missing level is a continuous missing level, the target output power of the target new energy station in the future period is predicted by the adjusted target power prediction model based on historical output power.

Specifically, if it is detected that the data of the future numerical weather prediction data is missing for more than 7 days, it is determined that the data missing level is the continuous missing level, and the prediction mode enters the intelligent spare tire mode at this time.

Figure 8:
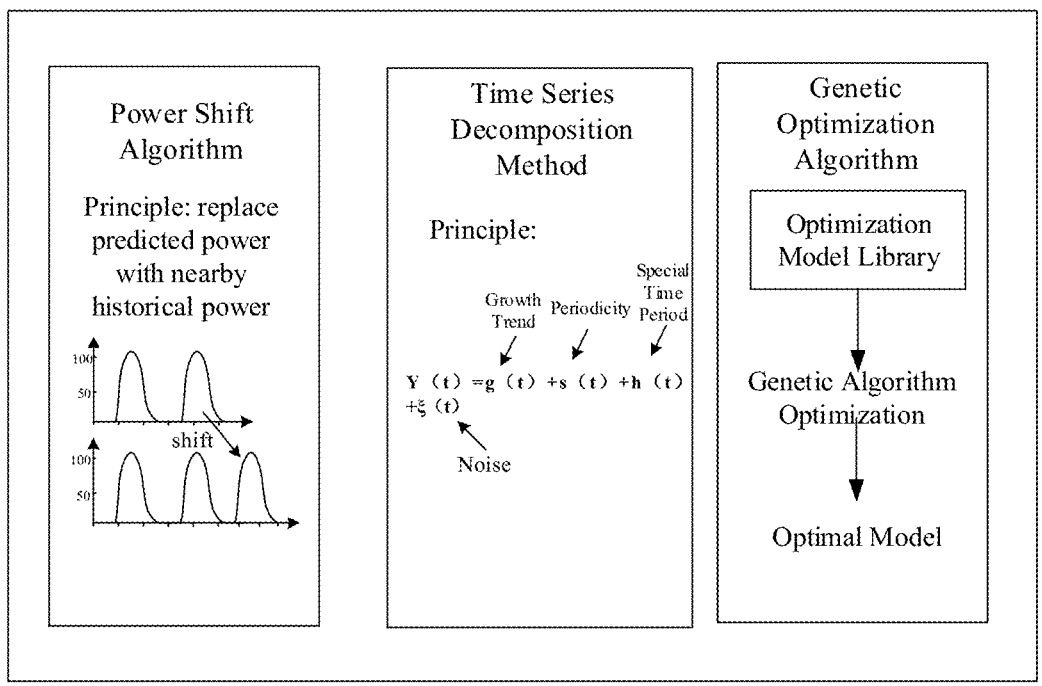
FIG. 8 is a schematic diagram of an algorithm for constructing an NWP model in an embodiment.

It can be understood that if the data missing level is the continuous missing level, then from the optional power prediction models belonging to the target new energy station in the set of power prediction models, the target power prediction model whose input data is {historical output power} is selected, such as the above non-NWP model. As shown in FIG. 8, the non-NWP model may be constructed based on the power shift algorithm, time series decomposition method, and genetic optimization algorithm. The principle of the power shift algorithm is to replace the predicted power with a nearby historical power. It can be understood that parameters refer to unknown numbers in the algorithm. Some parameters need to be specified manually, such as the learning efficiency in the neural network algorithm, and some parameters are fitted from the data, such as the coefficients in linear regression, and so on. When the selected algorithm is used for modeling, the parameters set or obtained may not be optimal or close to optimal, so the parameters need to be optimized to obtain a better prediction model. The essence of the genetic optimization algorithm is to select a batch of best parameters to make the objective function optimal. Optionally, in this embodiment, an optimization model library is first constructed based on various algorithms, and then the optimal model is selected from the optimization models based on a genetic optimization algorithm. The models in the optimization model library may include a generalized linear regression model (GLS), a generalized linear model (GLM), a vector autoregressive model (VAR), etc. The objective function in this embodiment is a function that makes the predicted output power of the model closer to the real output power. For example, the objective function may be root mean square error of relative start-up capacity, prediction pass rate, root mean square error of relative actual power, maximum absolute prediction deviation during load peak hours, or maximum daily absolute prediction deviation, etc.

Figure 9:
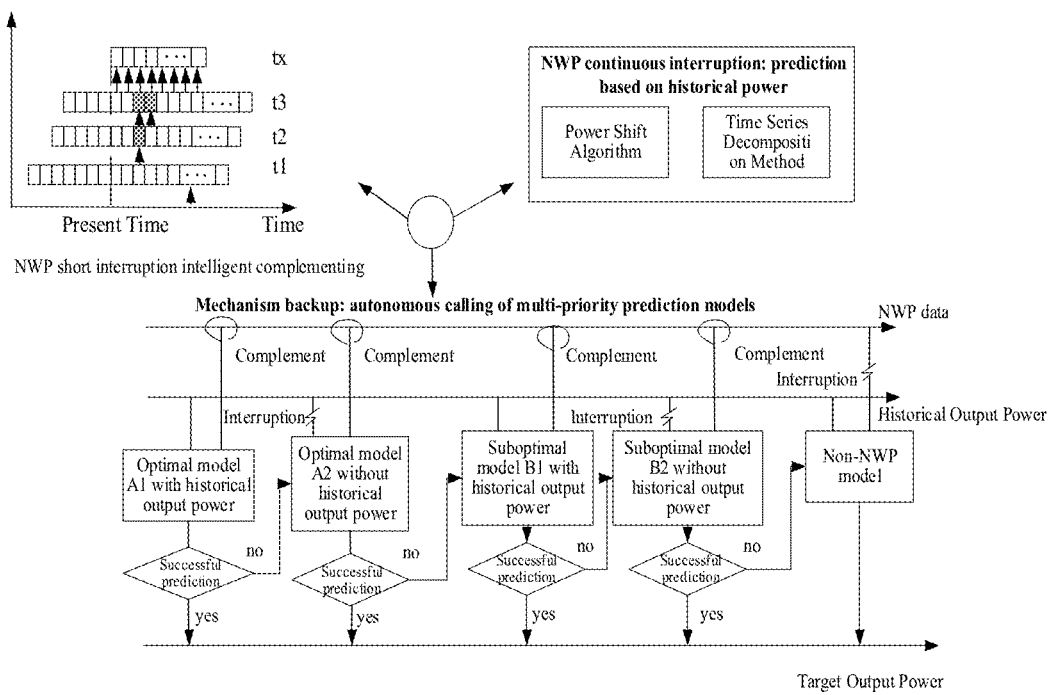
FIG. 9 is a schematic diagram of an intelligent spare tire mode in an embodiment.

Specifically, when performing prediction using the above NWP model, all the input data is {historical output power}. Therefore, based on the historical output power, the target output power of the target new energy station in the future period can be predicted. Further, as shown in FIG. 9, in the intelligent spare tire mode, the multiple back-up mechanism is enabled to realize the independent calling of multi-priority prediction models, that is, calling optimal model (the input includes historical output power), optimal model (the input does not include historical output power), sub-optimal model (the input does not include historical output power), sub-optimal model (the input does not include historical output power) and no NWP model in sequence.

It can be understood that in the intelligent spare tire mode, there are three calling situations.

(1) If the NWP data is not missing, the calling order of the optimal model and the sub-optimal model is determined based on the interruption of the historical output power. For example, as shown in FIG. 9, if there is no interruption in the historical output power, then the optimal model A1 (the input includes historical output power) is called preferentially, or the sub-optimal model B1 (the input includes historical output power) is called. If there is an interruption in the historical output power, the optimal model A2 (the input does not include historical output power) is called, or sub-optimal model B2 (the input does not include historical output power) is called.

(2) If the NWP data is missing, and the NWP data is available after complementing the missing data, the missing NWP data can be processed using the above-mentioned short-term interruption smart complementing method, or continuous interruption smart complementing method. After complementing, it is considered that there is no missing data in the NWP data, and the order of calling the optimal model and sub-optimal model is the same as the above situation (1).

(3) If the NWP data is missing and the NWP data is not available after complementing the missing data, when it is determined that there is no interruption in the historical output power, the non-NWP model is called.

In this embodiment, when there is no missing data in the NWP data (or when there is a short-term interruption), the model with historical output power or without historical output power can be called first according to the intelligent spare tire mode. When there is continuous missing of the NWP data, the target power prediction model whose input data is {historical output power} is automatically selected to realize automatic processing of the continuous missing situation.

Figure 10:
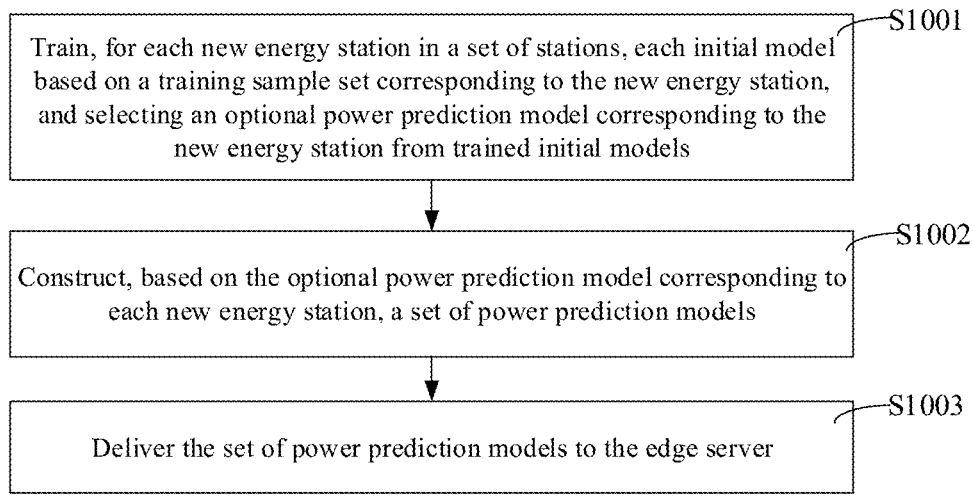
FIG. 10 is a schematic flow diagram of a method for automatic machine learning-based prediction of new energy power with cloud-edge collaboration in another embodiment.

In an embodiment, as shown in FIG. 10, a method for automatic machine learning-based prediction of new energy power with cloud-edge collaboration is provided. The method is described below by taking the method applied to the cloud server 104 in FIG. 1 as an example. The method includes the following steps.

In step S1001, for each new energy station in a set of stations, each initial model is trained based on a training sample set corresponding to the new energy station, and an optional power prediction model corresponding to the new energy station is selected from trained initial models.

The training sample set includes a plurality of groups of {sample weather prediction data, sample output power}. Different initial models are constructed based on different algorithms. For example, different initial models constructed based on different algorithms may include physical models, statistical models, more than 10 sets of AI models (as shown in FIG. 3), and other diversified prediction models.

Figure 11:
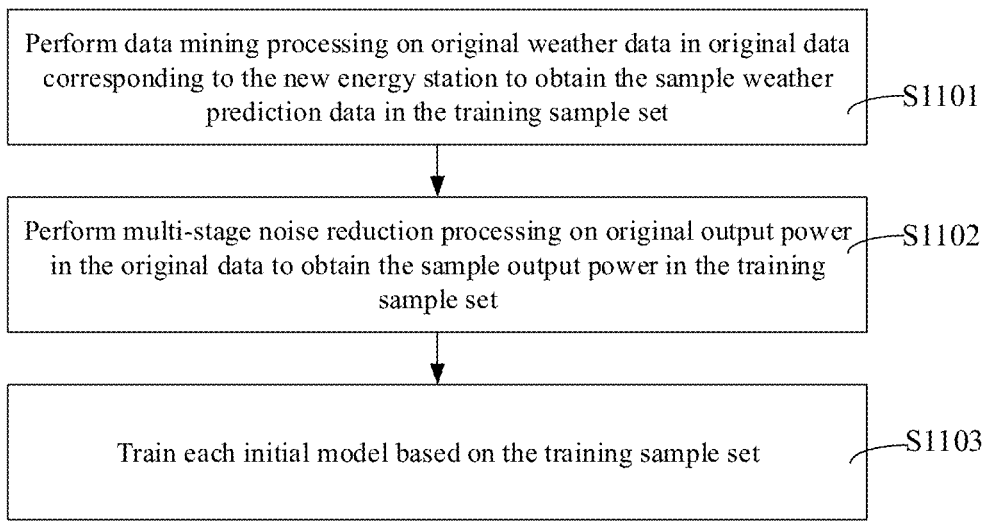
FIG. 11 is a schematic flow diagram of obtaining a training sample set in an embodiment.

Specifically, as shown in FIG. 11, training each initial model based on the training sample set corresponding to the new energy station includes the following steps.

In step S1101, data mining processing is performed on original weather data in original data corresponding to the new energy station to obtain the sample weather prediction data in the training sample set.

Figure 12:
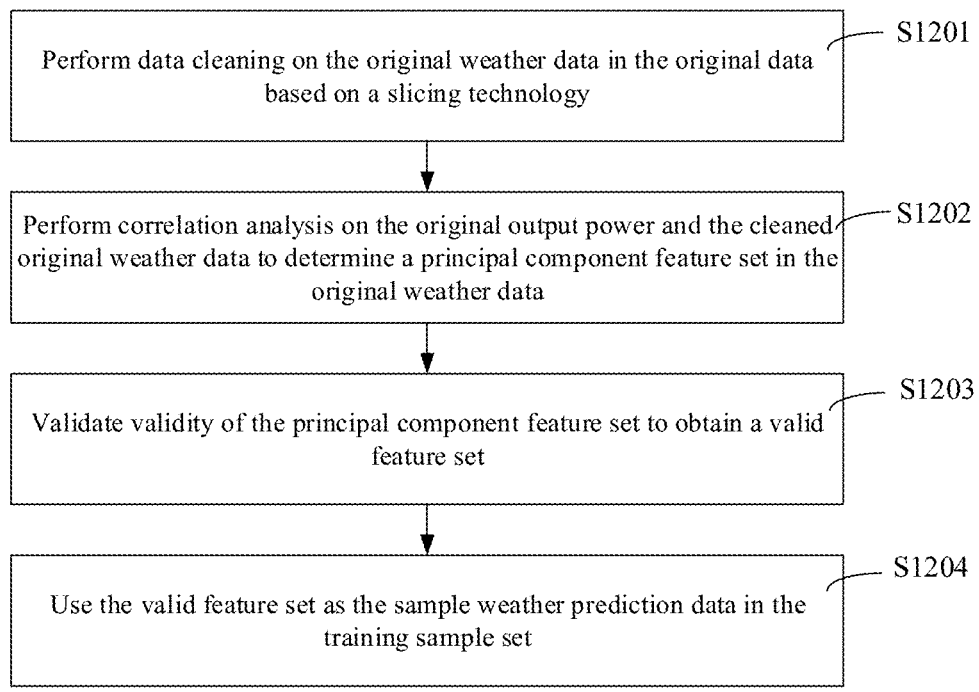
FIG. 12 is a schematic flow diagram of obtaining sample weather prediction data in a training sample set in an embodiment.

The original data corresponding to each new energy station includes original weather data (i.e., original numerical weather prediction data) and original power data (i.e., historical output power). The original weather data of each station has a large amount of data. For example, the southern region forecasts four times a day (forming four numerical weather prediction data), and the data amount of each forecast for the next 7 days is about 100G. In a single original numerical weather prediction data, the information is complex and the characteristic is redundant, and there are more than 150 NWP features. In addition, a large number of erroneous data, missing data, power limit data, etc. in the original power data are difficult to accurately identify, and data noise will seriously reduce the upper limit of prediction accuracy. If all the data and features in the original weather data are used for algorithm model training and prediction, it will cause problems such as a large amount of calculation, high computing power requirements, and lengthy time, and will cause interference to the power prediction model, increasing the complexity of model training and prediction greatly reduces the accuracy of the algorithm and its generalization ability. However, in the process of fully mining feature information, the curse of dimensionality is very easy to occur, and general data processing methods cannot completely solve the problem of huge amounts of original numerical data. Therefore, in order to improve the effectiveness of data processing, embodiments of the present disclosure need to perform data mining processing on the original data. Specifically, as shown in FIG. 12, the data mining processing on the original weather data may include the following steps.

In step S1201, data cleaning is performed on the original weather data in the original data based on a slicing technology.

In this embodiment, an extremely fast slicing and cleaning technology based on massive data is used. By using this technology, cleaning of 25G massive multi-dimensional meteorological data files with specified coordinates, time periods, feature quantities, etc. in a single numerical weather prediction data (original numerical weather prediction data) can be completed within 1 hour. The specific steps are as follows.

In step 01, massive multi-dimensional meteorological data files are extracted from the original weather data based on the specified coordinates, time period, feature quantities and other information.

The specified coordinates include the specified latitude and longitude.

In step 02, the slicing technology is used to slice multi-dimensional meteorological data files according to customized slicing rules to form a plurality of file slices.

In step 03, a distributed architecture is used for each file slice, and data extraction and data mining are performed in parallel, to extract the cleaned original weather data.

The cleaned original weather data includes a plurality of cleaned file slices. The data extraction and the data mining may be determined based on a preset data cleaning algorithm, to make the cleaned file slices contain corresponding target data information.

In step 04, the target data information in each cleaned file slice is loaded from the memory, and it is spliced and outputted to a unified table and database for storage.

Thereafter, further feature extraction is performed on the target data information in each cleaned file slice to obtain sample weather prediction data. Specifically, further feature extraction includes a step of meteorological feature cross-recursive optimization. The implementation process of this step includes: by cross validation and recursive elimination of algorithms such as correlation coefficients and random forests, more than 150 complex NWP data items in the target data information are screened for feature vectors, and 4 to 5 key feature vectors that have a prominent role in improving accuracy are located, to reduce the complexity and calculation amount of the power prediction model, reduce the interference of irrelevant meteorological features on the prediction accuracy, and improve the accuracy of new energy power prediction. The specific process may include the following steps.

In step S1202, correlation analysis is performed on the original output power and the cleaned original weather data to determine a principal component feature set in the original weather data.

Specifically, the specific implementation process of the above step S1202 is as follows.

In step 11, all features in the cleaned original weather data are initially screened based on the machine learning algorithm, features lower than the score screening threshold are discarded, and the remaining features are determined as the first feature set.

The machine learning algorithm may include a random forest algorithm. The random forest algorithm is a supervised learning algorithm and an integrated learning algorithm based on a decision tree as a learner. It can classify and filter all features by their importance. Optionally, the threshold is used as an input parameter for feature engineering and can be adjusted manually. The threshold defaults to 0.05.

In step 12, a correlation coefficient between the features of all dimensions in the filtered original weather data and the original output power is calculated based on the correlation analysis, the feature whose absolute value of the correlation coefficient is lower than the correlation threshold is discarded, and the remaining features are determined as the second feature set.

The correlation coefficient may be a correlation coefficient after taking an absolute value.

Specifically, when correlation analysis is performed, corr( ) function in python may be called to form a correlation analysis matrix, and then subsequent analysis may be performed, which is equivalent to a data matrix being directly inputted and a matrix of correlation values being outputted.

Optionally, the correlation threshold is used as an input parameter for feature engineering and can be adjusted manually. The threshold of photovoltaic defaults to 0.2 and the threshold of wind power defaults to 0.45.

In step 13, the principal component feature set in the original weather data is formed based on the union of the first feature set and the second feature set.

In step S1203, the validity of the principal component feature set is validated to obtain a valid feature set.

Specifically, K-fold cross validation and recursive elimination methods are used to validate the validity of the above principal component feature set, and a valid feature set is obtained.

In step S1204, the valid feature set is used as the sample weather prediction data in the training sample set.

Finally, the valid feature set is used as a return value of feature engineering in the form of a list, and is used as sample weather prediction data in the training sample set for power model training.

After the step S1101, the sample weather prediction data in the training sample set is obtained, and then the original data is continued to be processed to obtain the sample output power in the training sample set. The specific process includes the following steps.

In step S1102, multi-stage noise reduction processing is performed on the original output power in the original data to obtain the sample output power in the training sample set.

Optionally, the step of performing multi-stage noise reduction on the original output power in the step S1102 specifically includes the following steps.

In step 21, obviously abnormal data in the original power data, such as exceeding the installed capacity of the new energy station or negative original output power, is identified and corrected, and the power data of a photovoltaic device in a night period is reset to zero.

It can be understood that most of the reasons for negative values are problems with the accuracy of the acquisition equipment. For example, after the hardware ages, its measurement range does not start from zero but starts from a negative value.

Instep 22, based on the meteorological-power correlation calculated between the original weather data and the original power data, a meteorological-power depth mapping relationship is established.

In step 23, for any time or time period, when the original weather data corresponding to the time or time period is known, estimated power data corresponding to the station at the time or time period is estimated according to the meteorological-power depth mapping relationship.

In step 24, the estimated power data is compared with the original power data. If the difference between the original power data and the estimated power data is greater than the preset difference, then the time or time period is determined as the power limit period and communication interruption period of the new energy station.

The difference between the original power data and the estimated power data is greater than the preset difference, indicating that the original power data is far lower than the estimated power data.

In step 25, the original power data during the power limit period and the communication interruption period is corrected to implement data noise removal processing and obtain the original power data after multi-stage noise reduction.

The original power data after multi-stage denoising is the sample output power in the training sample set.

Figure 13:
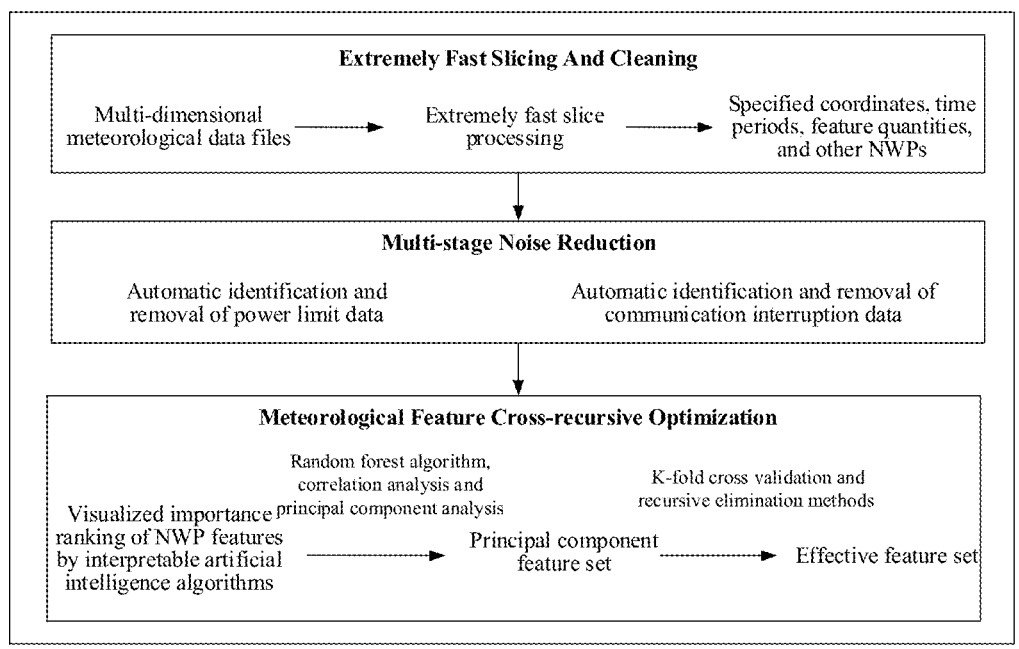
FIG. 13 is a schematic diagram of data cleaning, multistage noise reduction, and weather cross-recursive optimization in an embodiment.

Specifically, the above-mentioned process of data cleaning steps, multi-stage noise reduction steps, and meteorological cross-recursive optimization steps based on the slicing technology is shown in FIG. 13.

In step S1103, each initial model is trained based on the training sample set.

Figure 14:
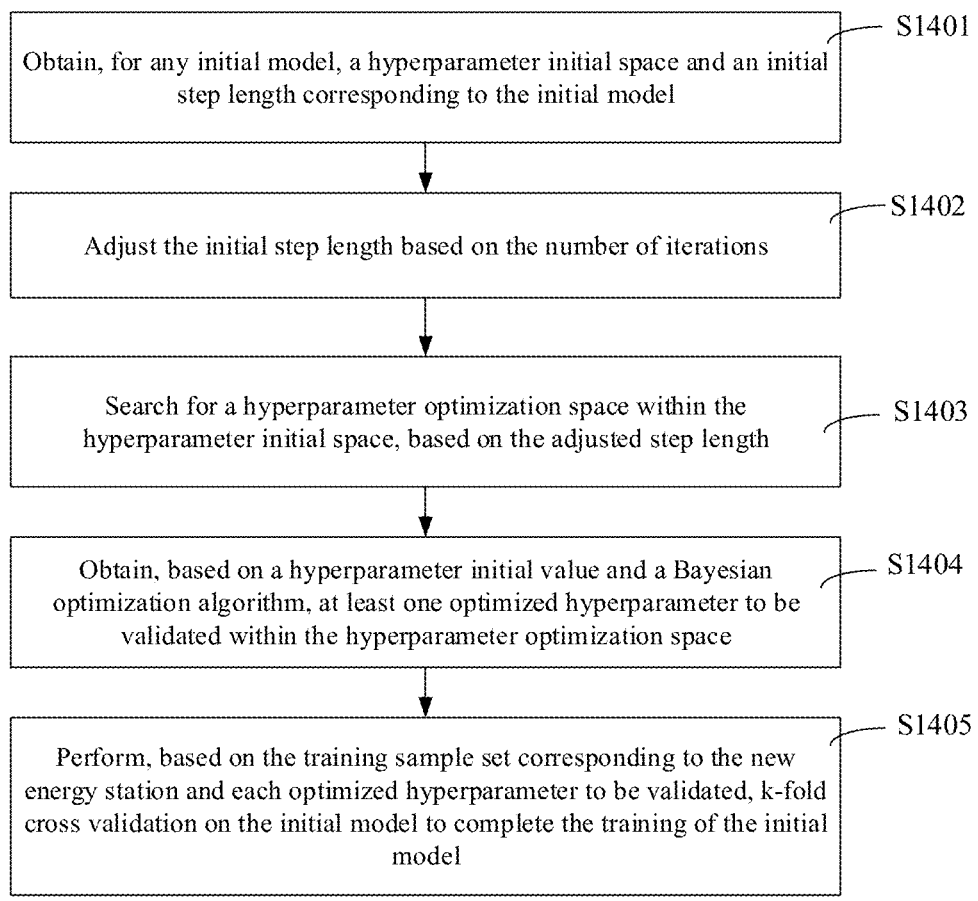
FIG. 14 is a schematic flow diagram of training an initial model in an embodiment.

Specifically, the training process in this embodiment is automatically executed by a full-cycle automatic machine learning algorithm. The variable step parameter optimization can be carried out automatically and the machine learning model parameters can be adjusted automatically by the training link in the full-cycle automatic machine learning algorithm. On the basis of optimal parameters, multi-model integrated learning is carried out to automatically to train and match the optimal models adapted to different prediction business objects, as shown in FIG. 14. The specific process may include the following steps.

In step S1401, for any initial model, the hyperparameter initial space and initial step length corresponding to the initial model are obtained.

In step S1402, the initial step length is adjusted based on the number of iterations.

Specifically, the calculation is based on the number of iterations of the search, the size of the improvement between each iteration, and the data size. As the number of iterations increases and the improvement value decreases, the number of steps decreases.

$$d_{k+1} = \begin{cases} d_k * e^{-\frac{f_k - f_{k-1}}{f_k}}, & \text{when } f_k - f_{k-1} < 0 \\ d_k, & \text{when } f_k - f_{k-1} \geq 0 \end{cases} \quad (5)$$

In formula (5), k is the number of iterations, $f_k$ is the optimization objective function value calculated at the k-th iteration, where the root mean square error between the prediction result and the actual power is the optimization goal, and $d_k$ is the step length of the k-th iteration.

In step S1403, the hyperparameter optimization space is obtained by searching within the hyperparameter initial space based on the adjusted step length.

In terms of variable step length optimization of model hyperparameters, a large step length is first used to conduct a preliminary search for the reasonable selection range of the initial model hyperparameters (hyperparameter initial space), to reduce the parameter search space and obtain the hyperparameter optimization space.

Large step lengths can be set based on experience values.

In step S1404, at least one optimized hyperparameter to be validated is obtained within the hyperparameter optimization space based on a hyperparameter initial value and a Bayesian optimization algorithm.

Specifically, small step lengths are used to perform grid optimization of hyperparameters in the hyperparameter optimization space, to find the hyperparameters that make the initial model perform best on the test data set, and to establish an automatic optimization mechanism for model hyperparameters, thereby improving the prediction accuracy.

Figure 15:
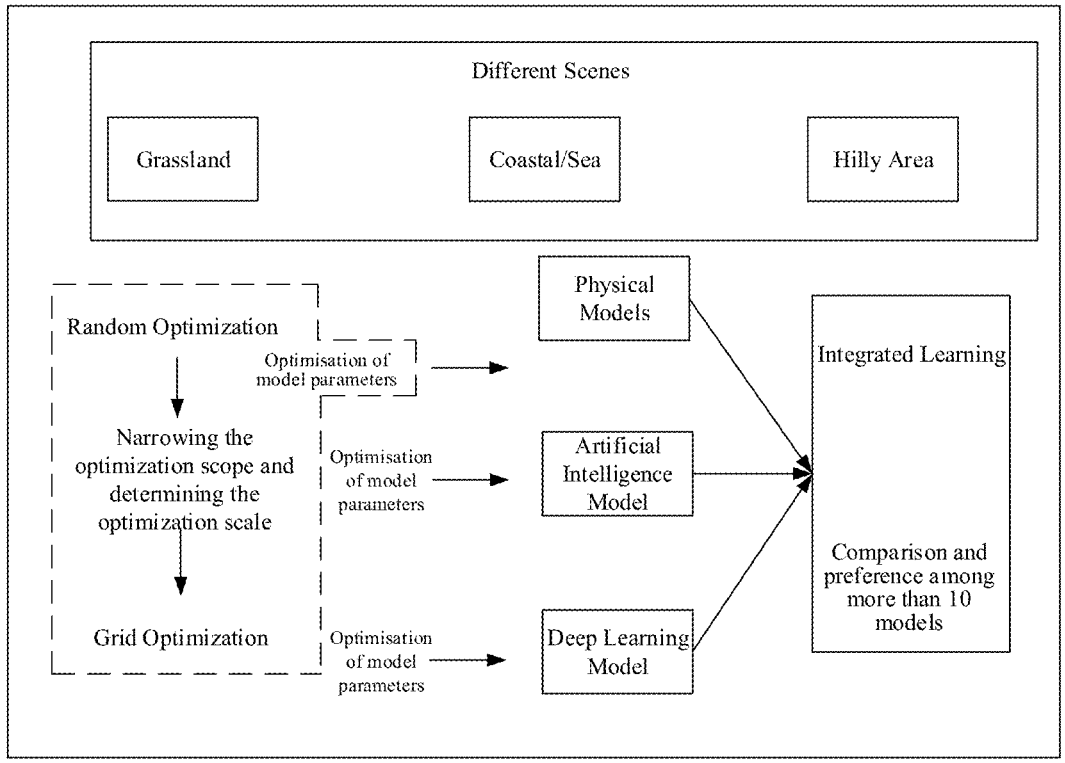
FIG. 15 is a schematic diagram of integrated learning of models in an embodiment.

As shown in FIG. 15, in the model hyperparameter optimization processes (step S1401 of random optimization, step S1402 of determining the optimization scale, step S1403 of narrowing the optimization scope, step S1404 of grid optimization), the optimized model parameters are obtained. The physical models, the artificial intelligence models, and the deep learning models are constructed based on the optimized model parameters and different algorithms, and then integrated learning is performed on the physical models, artificial intelligence models, and deep learning models. Integrated learning refers to the use of a plurality of decision-makers (a plurality of models) jointly make a decision (power prediction).

Optionally, in this embodiment, a sequential model optimization algorithm is used to solve the non-differentiable, discontinuous and high-cost objective function of prediction model hyperparameter optimization in the hyperparameter optimization space. In the Bayesian optimization of hyperparameters, the basic steps are as follows.

In step 31, the error probability distribution p(y|x) of a model M under a set of hyperparameters x is initialized, where y is the actual value of the objective function using the hyperparameter set x.

In step 32, a new set of hyperparameters x* is constructed, as shown in the following formula (6):

$$x^* = \arg\min S(x, M_t-1, H) \quad (6),$$

where S is a collection function.

In step 33, an objective function $f(x^*)$ under the set of hyperparameters is calculated.

In step 34, the sample set $H = H \cup (x^*, f(x^*))$ is updated.

In step 35, the new p(y|x, H) is estimated based on H.

In step 36, looping is started from the step 32 until the maximum number of iterations is reached.

It can be understood that the previously calculated point x is used by Bayesian optimization to calculate the posterior expectation value of the objective function $f$, and a specific sampling function is used to calculate the objective function $f$ at the new x* to minimize the newly calculated $f$. Repeat the above steps (step 31 to step 36) until the maximum number of iterations is reached or the convergence condition is reached.

The prior probability p(y|M) generally includes the Gaussian method and the tree parzen estimator method (TPE), and the latter is used in this embodiment.

The TPE algorithm defines y* to be the quantile $\gamma$ of the observed value y, so $\gamma = p(y<y^*)$. In order to find the best sampling point of the objective function, the most commonly used is expected improvement (EI), and the formula (7) is as follows:

$$EI_{y^*}(x) = \frac{\gamma y * l(x) - l(x) \int_{-\infty}^{y^*} p(y) dy}{\gamma l(x) + (1-\gamma) g(x)} \propto \left( \gamma + \frac{g(x)}{l(x)} (1-\lambda) \right)^{-1}, \quad (7)$$

where l(x) is the probability density function formed by using the observed values {x(i)} such that the corresponding loss $f(x(i))$ is less than y*, and g (x) is the probability formed using the remaining observed values density function.

It can be seen from the above formula that in order to maximize EI, l(x) should be maximized and g (x) should be minimized. In the sequential model-based optimization for general algorithm configuration (SMBO) algorithm, TPE can find the next set of hyperparameters x* that maximize EI. Finally, the corresponding hyperparameter group x* that minimizes the objective function $f(x)$ is obtained through iteration.

In step S1405, k-fold cross validation is performed on the initial model based on the training sample set corresponding to the new energy station and each optimized hyperparameter to be validated, to complete the training of the initial model.

Optionally, in this embodiment, during the process of Bayesian hyperparameter optimization, k-fold cross validation is combined to carry out model training iterations.

Specifically, the k-fold cross validation means that during initial sampling, the training sample set is divided into k sub-samples, a single sub-sample is retained as data for validating the model, and the other k−1 samples are used to train the model. The cross validation is repeated k times, each subsample is validated once, and the model with the minimum root mean square error is selected as the final model. The advantage of this method is that the variance is reduced by averaging the training results of k different groups. Therefore, the performance of the model is less sensitive to the division of data, which can avoid model overfitting and enhance the generalization ability of the model. The specific process is as follows.

In the first step, the training sample set is randomly divided into k parts without repeated sampling.

In the second step, one part is selected as the validation set each time, and the remaining k−1 parts are used as the training set for training the initial model.

In the third step, the second step is repeated k times, so that each subset has one chance to serve as the validation set, and has the remaining chances to serve as the training set. After training on each training set, a model is obtained. The model is used to perform power prediction on the corresponding validation set, and the evaluation indicators of the model are calculated and saved.

In the fourth step, the k sets of test results is ranked, and the model with the minimum root mean square error is selected as the training model output under k-fold cross validation and as the optimal model evaluated during Bayesian hyperparameter optimization in the present iteration number.

It can be understood that the above-mentioned optimal model can be the optimal model A1 in the aforementioned example. Through the above method, the sub-optimal model B1 corresponding to the sub-optimal hyperparameters, the optimal NWP-free model, etc. can also be obtained.

In step S1002, a set of power prediction models is constructed based on the optional power prediction models corresponding to the new energy stations respectively.

Figure 16:
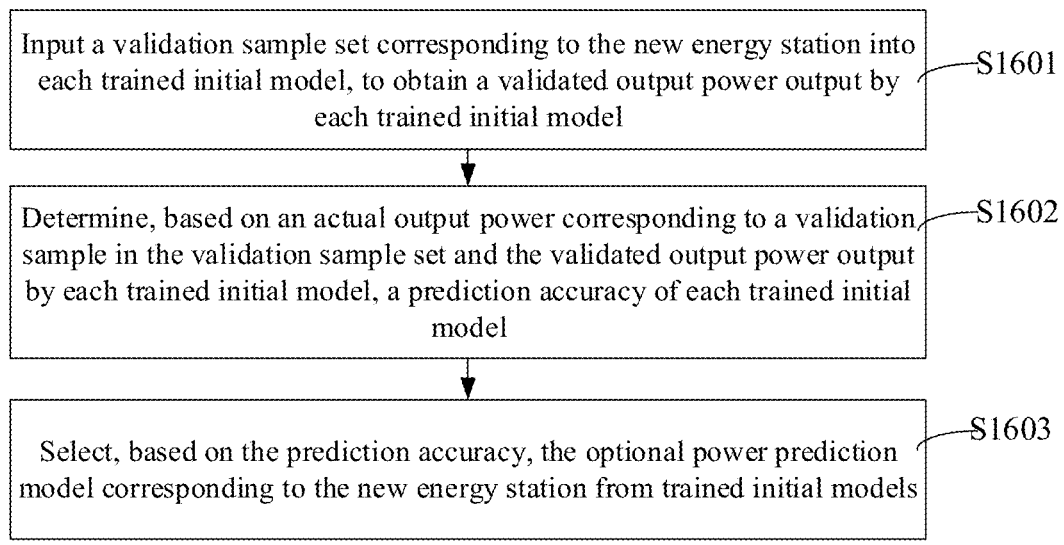
FIG. 16 is a schematic flow diagram of determining an optional predictive power model in an embodiment.

After the step S1001, the training of each initial model is completed, and the model with the highest prediction accuracy for each new energy station is adaptively selected according to different station types, topography, and climate conditions. Taking any new energy station of step S1001 as an example, as shown in FIG. 16, the specific process may include the following steps.

In step 1601, a validation sample set corresponding to the new energy station is inputted into each trained initial model, to obtain a validated output power output by each trained initial model.

In step 1602, a prediction accuracy of each trained initial model is determined, based on an actual output power corresponding to a validation sample in the validation sample set and the validated output power output by each trained initial model.

In step 1603, the optional power prediction model corresponding to the new energy station is selected from trained initial models based on the prediction accuracy.

In this embodiment, an initial model whose prediction accuracy meets the preset accuracy is targeted and matched for each new energy station, as the optional power prediction model of the new energy station, constructing a high-precision optional power prediction model for each new energy station.

Further, with the passage of time, some new energy stations have reduced the practicality of the original model due to adjustments in operating methods or capacity expansion and transformation. On the other hand, as new energy stations accumulate more historical operating data, the model optimization training is provided with a richer sample set. Therefore, in order to continuously improve the new energy power prediction accuracy for the station, it is necessary to regularly review the optional power prediction model corresponding to each new energy station, continuously match the trained initial model corresponding to each new energy station in the background, calculate the prediction accuracy of the initial model, update the present optimal prediction model, and train and match different prediction models for each new energy station in different time periods to achieve dynamic adaptation of the model.

Figure 17:
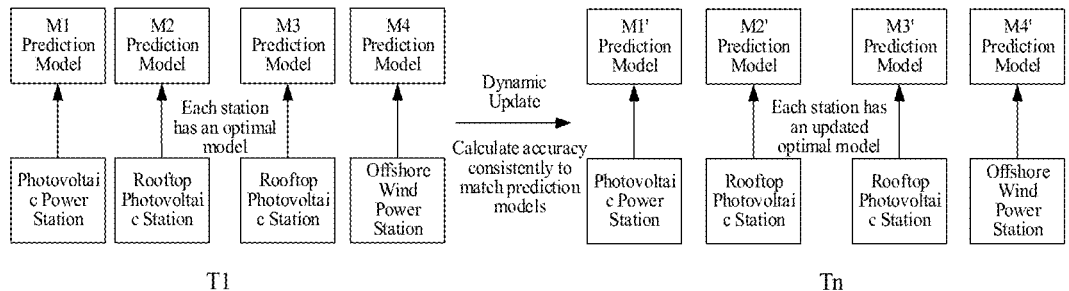
FIG. 17 is a schematic diagram of regularly updating each power prediction model in an embodiment.

In this embodiment, the short-term prediction model may be updated on a natural year cycle, and the ultra-short-term prediction model may be updated on a quarterly cycle. The model with the best forecast accuracy can always be customized for the new energy station to achieve differentiated forecasts. As shown in FIG. 17, at time t1, each station corresponds to its own optimal model, and each model is continuously and dynamically updated. For example, if the update interval is (tn-t1), then updated optimal model corresponding to each station can be obtained at time tn.

After the set of power prediction models has been obtained by training of the step S1001 and the step S1002, it also includes the following steps.

In step S1003, the set of power prediction models is delivered to the edge server.

The cloud-edge collaboration prediction system in this embodiment is divided into three different versions of the system according to the business. The first one is a cloud version of the prediction system. The cloud version is deployed in the power grid cloud IV area and is responsible for the construction of the full-cycle automatic machine learning sample library and the full-cycle automatic machine learning training. The second one is a main station version of the prediction system. The main station version is deployed in a power dispatch main station, a power generation group forecast center, etc., which is responsible for the full-cycle automatic machine learning forecast on the main station. The third one is a substation version of the prediction system. The substation version is deployed in new energy stations, which directly undertakes the power prediction business of the new energy stations.

Optionally, the method for automatic machine learning-based prediction of new energy power with cloud-edge collaboration in this embodiment is implemented based on the full-cycle machine learning technology algorithm and based on the full-cycle machine learning technology architecture.

Figure 18:
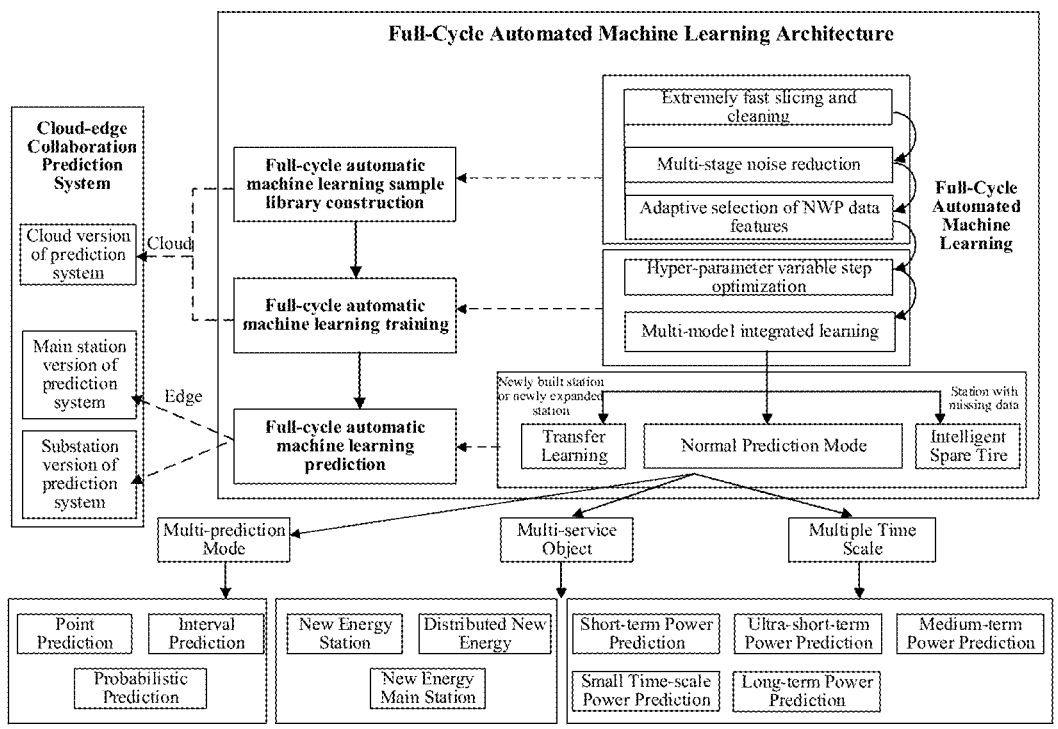
FIG. 18 is a schematic diagram of an algorithm architecture of full-cycle automatic machine learning in an embodiment.

As shown in FIG. 18, the full-cycle machine learning technology algorithm architecture includes three parts: full-cycle automatic machine learning sample library construction, full-cycle automatic machine learning training, and full-cycle automatic machine learning prediction. The sub-steps corresponding to extremely fast slice cleaning in the construction of the full-cycle automatic machine learning sample library refer to the above-mentioned step S1201. The sub-steps corresponding to the multi-stage noise reduction in the construction of the full-cycle automatic machine learning sample library refer to the above-mentioned step S1102.

The sub-steps corresponding to the adaptive selection of NWP data features in the construction of the full-cycle automatic machine learning sample library specifically refer to the above-mentioned step S1202, step S1203 and step S1204. Further, the sub-steps corresponding to the hyper-parameter variable step optimization in full-cycle automatic machine learning training specifically refer to the above-mentioned step S1401 to step S1405, and the sub-steps corresponding to multi-model integrated learning in full-cycle automatic machine learning training specifically refer to the above-mentioned step S1002. Further, the sub-steps corresponding to transfer learning in full-cycle automatic machine learning prediction specifically refer to the above-mentioned step S501 to step S503. The sub-steps corresponding to the normal prediction mode in the full-cycle automatic machine learning prediction specifically refer to the above-mentioned step S204. The sub-steps corresponding to the smart spare tire in the full-cycle automatic machine learning prediction specifically refer to the processes shown in FIG. 9.

Figure 19:
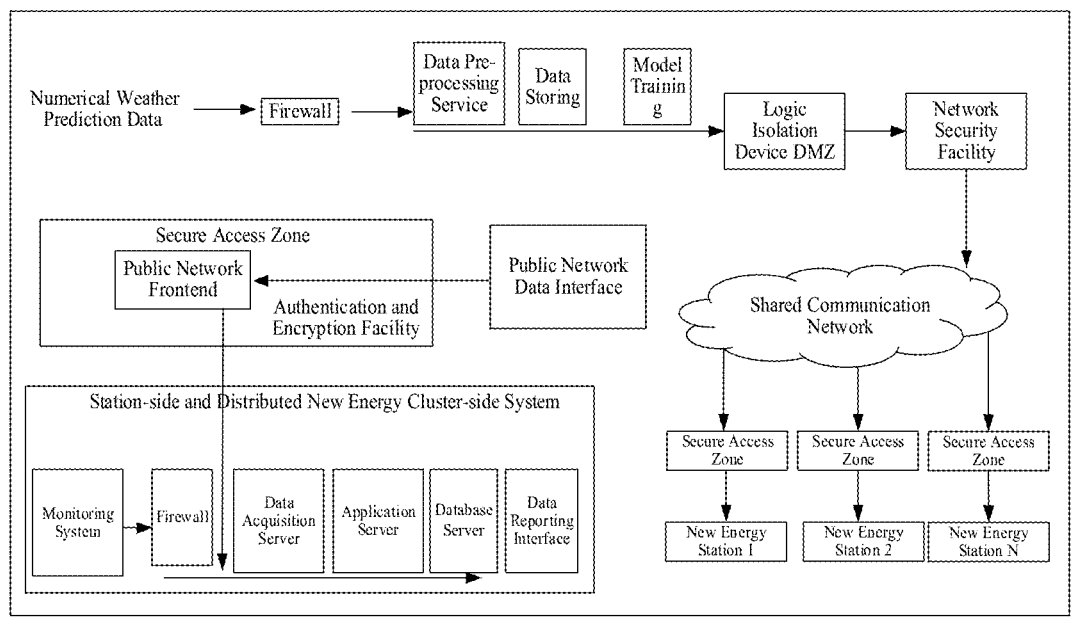
FIG. 19 is a schematic diagram of a deployment process of an edge-cloud collaborative system prediction model.

Specifically, as shown in FIG. 19, when performing target power prediction, the new energy prediction system (cloud version) is deployed in the power grid cloud security IV area and pulls NWP data (future numerical weather prediction data) from the power grid data center. After cloud training, the model and the NWP data of the specific site are pushed to the internal and external network exchange platform (unstructured channel). The safe V zone pulls the target prediction model and NWP data from the unstructured channel and pushes them to power grid public cloud. As a result, the main station, field station, etc. for specific prediction services can pull the NWP data and target prediction model required to carry out specific business from the public cloud, and carry out prediction services at the main station, field station and other business ends, which greatly take advantage of cloud-edge collaborative new energy power prediction.

Figure 20:
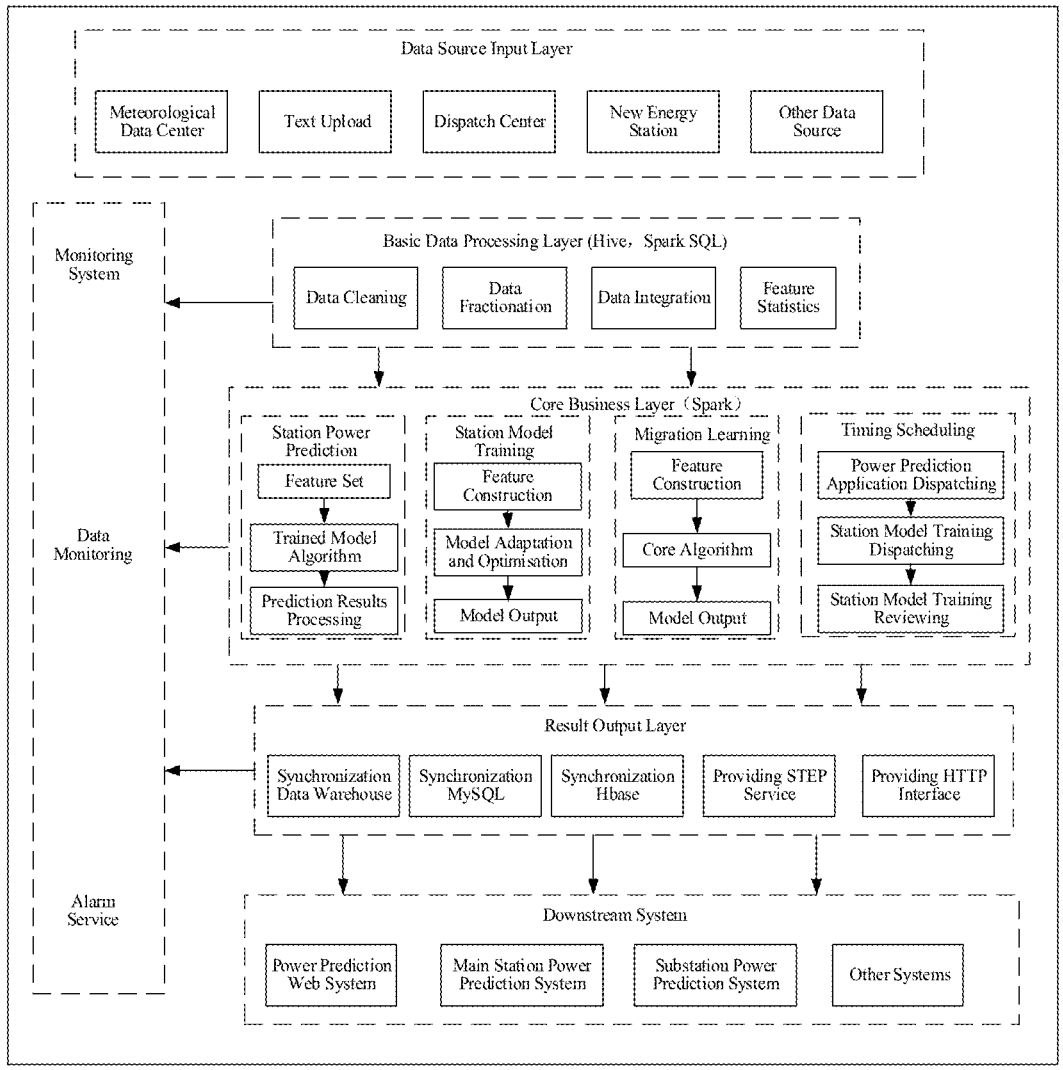
FIG. 20 is a schematic diagram of a system framework of edge-cloud collaboration.

As shown in FIG. 20, it is a schematic diagram of the system framework of edge-cloud collaboration. The system framework includes a data source input layer, a basic data processing layer (Hive, Spark SQL), a core business layer, a result output layer and a downstream system. Further, a monitoring system, a data monitoring service and an alarm service are also provided.

The data source input layer includes a meteorological data center module, a text upload module, a dispatch center module, a new energy station module, and other data source modules. The basic data processing layer (Hive, Spark SQL) includes a data cleaning module, a data fractionation module, a data integration module and a feature statistics module. The core business layer includes a station power prediction module, a station model training module, a transfer learning module and a timing scheduling module. The result output layer includes a synchronization data warehouse module, a synchronization MySQL module, a synchronization Hbase module, a STEP service provision module and a HTTP interface provision module. The downstream system includes a power prediction Web system, a main station power prediction system, a substation power prediction system, and other systems.

It should be understood that although the steps in the flowcharts involved in the above embodiments are shown in sequence as indicated by the arrows, these steps are not necessarily executed in the order indicated by the arrows. Unless explicitly stated in this article, there is no strict order restriction on the execution of these steps, and these steps can be executed in other orders. Moreover, at least some of the steps in the flowcharts involved in the above embodiments may include multiple steps or multiple stages. These steps or stages are not necessarily executed at the same time, but may be executed at different times. The execution order of these steps or stages is not necessarily sequential, but may be performed in turn or alternately with other steps or at least part of the steps or stages in other steps.

In an embodiment, a system for automatic machine learning-based prediction of new energy power with cloud-edge collaboration is provided. The system includes a cloud server and an edge server.

The cloud server is configured to train each initial model based on a training sample set corresponding to a new energy station for each new energy station in the set of stations, and select an optional power prediction model corresponding to the new energy station from the trained initial models. The training sample set includes sample weather prediction data and sample output power, and different initial models are constructed based on different algorithms. The cloud server is further configured to construct a power prediction model based on the optional power prediction model corresponding to each new energy station. The cloud server is further configured to deliver the set of power prediction models to the edge server.

The edge server is configured to: receive the set of power prediction models; obtain, in response to a power prediction demand for a target new energy station, future numerical weather prediction data of the target new energy station in a future period and historical output power of a historical period corresponding to the future period; select, based on missing of the future numerical weather prediction data and a data amount of the historical output power, a target power prediction model corresponding to the target new energy station from a set of power prediction models, each optional power prediction model in the set of power prediction models being trained and delivered by the cloud server based on the automatic machine learning algorithm; determine, based on the power prediction demand, the target working mode of the target power prediction model, the target working mode including a prediction business object, a prediction type, and a prediction time scale; and adjust the target power prediction model according to the target working mode, and predict, by the adjusted target power prediction model, the target output power of the target new energy station in the future period based on the future numerical weather prediction data of the future period and the historical output power of the historical period corresponding to the future period.

Based on the same inventive concept, embodiments of the present disclosure also provide a device 1 for automatic machine learning-based prediction of new energy power with cloud-edge collaboration for implementing the above-mentioned method for automatic machine learning-based prediction of new energy power with cloud-edge collaboration. The implementation of the device is similar to the implementation of the above method. Therefore, the specific limitations in the embodiments of one or more devices for automatic machine learning-based prediction of new energy power with cloud-edge collaboration provided below can be found in the limitations of the method for automatic machine learning-based prediction of new energy power with cloud-edge collaboration mentioned above, which will not be repeated here.

Figure 21:
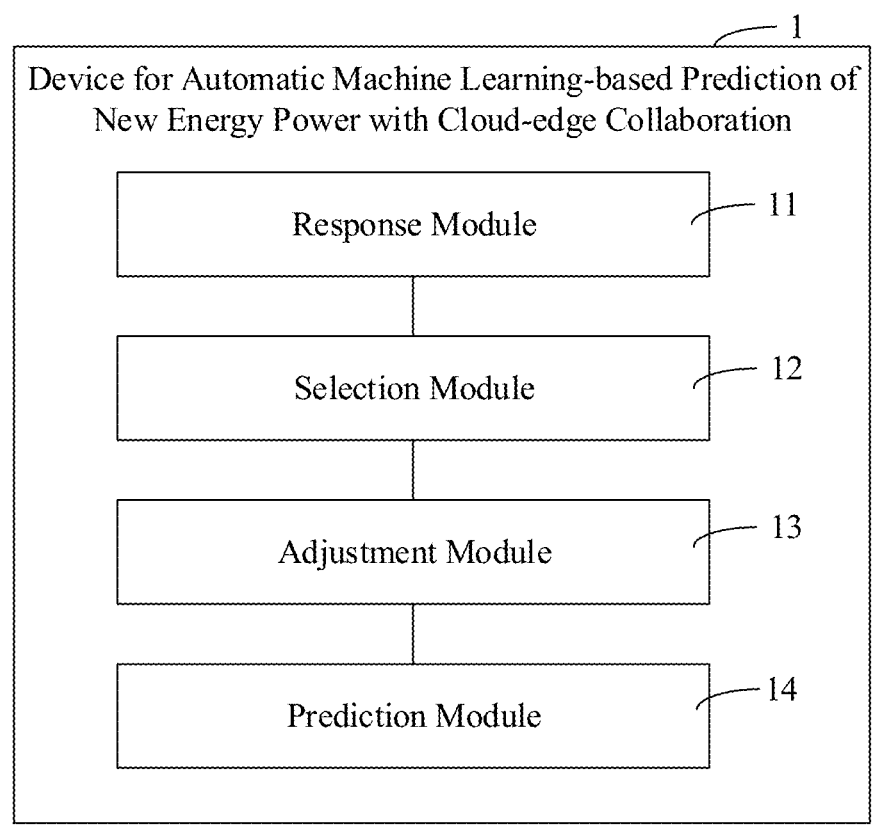
FIG. 21 is a diagram illustrating a device for automatic machine learning-based prediction of new energy power with cloud-edge collaboration in an embodiment.
Figure 22:
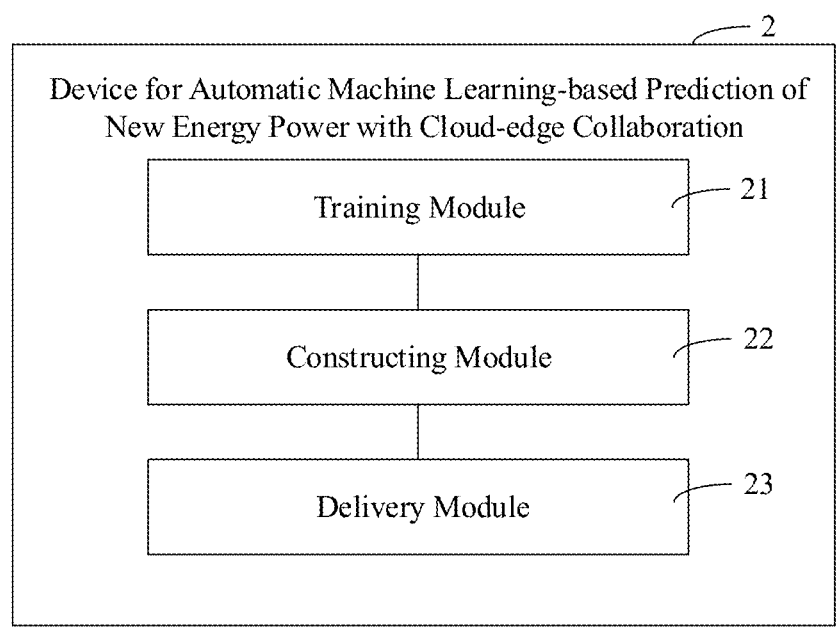
FIG. 22 is a diagram illustrating a device for automatic machine learning-based prediction of new energy power with cloud-edge collaboration in an embodiment.

In an embodiment, as shown in FIG. 21, a device 1 for automatic machine learning-based prediction of new energy power with cloud-edge collaboration is provided. The device 1 includes a response module 11, a selection module 12, an adjustment module 13 and a prediction module 14.

The response module 11 is configured to obtain, in respond to the power prediction demand for the target new energy station, the future numerical weather prediction data of the target new energy station in a future period and the historical output power of the historical period corresponding to the future period.

The selection module 12 is configured to select the target power prediction model corresponding to the target new energy station from the set of power prediction models, based on the missing of future numerical weather prediction data and the data amount of the historical output power. Each optional power prediction model in the set of power prediction models is trained and delivered by the cloud server based on the automatic machine learning algorithm.

The adjustment module 13 is configured to determine the target working mode of the target power prediction model based on the power prediction demand. The target working mode includes a prediction business object, a prediction type, and a prediction time scale.

The prediction module 14 is configured to adjust the target power prediction model according to the target working mode, and predict, by the adjusted target power prediction model, the target output power of the target new energy station in the future period, based on the future numerical weather prediction data of the future period and the historical output power of the historical period corresponding to the future period.

In an embodiment, selection module 12 includes a first screening sub-module and a first matching sub-module.

The first screening sub-module is configured to determine, when the target new energy station is identified as a non-newly built station or non-expanded station based on the data amount of the historical output power, a data missing level of the future numerical weather prediction data based on the missing of the future numerical weather prediction data.

The first matching sub-module is configured to select, based on the data missing level, the target power prediction model from the optional power prediction models belonging to the target new energy station in the set of power prediction models.

In an embodiment, the selection module 12 includes a second screening sub-module, a similarity calculation sub-module and a second matching sub-module.

The second screening sub-module is configured to determine, when the target new energy station is identified as a newly built station or a newly expanded station based on the data amount of the historical output power, a data missing level of the future numerical weather prediction data based on the missing of the future numerical weather prediction data.

The similarity calculation sub-module is configured to select, based on basic information of the target new energy station, a similar station whose similarity to the target new energy station reaches a similarity threshold from other new energy stations, the other new energy stations being stations in a set of stations except the target new energy station.

The second matching sub-module is configured to select, based on the data missing level, the target power prediction model corresponding to the target new energy station, from the optional power prediction models pertaining to the similar station in the set of power prediction models.

In an embodiment, prediction module 14 includes a complementing sub-module and a prediction sub-module.

The complementing sub-module is configured to complement, if the data missing level is a scattered missing level, missing data in the future numerical weather prediction data, and predicting, by the adjusted target power prediction model, the target output power of the target new energy station in the future period, based on the historical output power and the complemented future numerical weather prediction data.

The prediction sub-module is configured to predict, if the data missing level is a continuous missing level, the target output power of the target new energy station in the future period, by the adjusted target power prediction model and historical output power.

In an embodiment, the similarity calculation sub-module is further configured to: obtain the basic information of the target new energy station and the basic information of each of the other new energy stations. The basic information includes at least one dimension data selected from a group consisting of longitude and latitude data, capacity data, terrain data, landform data and altitude data.

The similarity calculation sub-module is further configured to: determine, based on the basic information of the target new energy station and the basic information of each of the other new energy stations, a value of similarity between the target new energy station and each of the other new energy stations in each dimension data; and select, based on the value of similarity between the target new energy station and each of the other new energy stations in each dimension data, the similar station whose similarity to the target new energy station reaches the similarity threshold, from the other new energy stations.

In an embodiment, the prediction module 14 is further configured to: obtain a grid position of the target new energy station, if a station type is a distributed new energy source; and predict, by the adjusted target power prediction model, the target output power of the target new energy station in the future period, based on the historical output power and the future numerical weather prediction data corresponding to the grid position.

In an embodiment, a device 2 for automatic machine learning-based prediction of new energy power with cloud-edge collaboration is provided. The device 2 includes a training module 21, a constructing module 22 and a delivery module 23.

The training module 21 is configured to: train, for each new energy station in a set of stations, each initial model based on a training sample set corresponding to the new energy station; and select an optional power prediction model corresponding to the new energy station from trained initial models. The training sample set includes sample weather prediction data and sample output power, and different initial models being constructed based on different algorithms.

The constructing module 22 is configured to construct a set of power prediction models based on the optional power prediction model corresponding to each new energy station. The set of power prediction models is configured for an edge server to: select a target power prediction model corresponding to the target new energy station, based on missing of future numerical weather prediction data of the target new energy station in the future period and a data amount of the historical output power of the target new energy station in the historical period corresponding to the future period; and adjust the target power prediction model in a target working mode, and predict, by the adjusted target power prediction model, the target output power of the target new energy station in the future period based on the future numerical weather prediction data of the future period and the historical output power of the historical period corresponding to the future period.

The delivery module 23 is configured to deliver the set of power prediction models to the edge server.

In an embodiment, the training module 21 includes a data mining sub-module, a noise reduction processing sub-module and a training sub-module.

The data mining sub-module is configured to perform data mining processing on original weather data in original data corresponding to the new energy station to obtain the sample weather prediction data in the training sample set.

The noise reduction processing sub-module is configured to perform multi-stage noise reduction processing on original output power in the original data to obtain the sample output power in the training sample set.

The training sub-module is configured to train each initial model based on the training sample set.

In an embodiment, the data mining sub-module is further configured to: perform data cleaning on the original weather data in the original data based on a slicing technology; perform correlation analysis on the original output power and the cleaned original weather data to determine a principal component feature set in the original weather data; validate the validity of the principal component feature set to obtain a valid feature set; and use the valid feature set as the sample weather prediction data in the training sample set.

In an embodiment, the training module 21 is further configured to: obtain, for any initial model, a hyperparameter initial space and an initial step length corresponding to the initial model; adjust the initial step length based on the number of iterations; search, based on the adjusted step length, the hyperparameter optimization space within the hyperparameter initial space; obtain at least one optimized hyperparameter to be validated within the hyperparameter optimization space, based on a hyperparameter initial value and a Bayesian optimization algorithm; and perform k-fold cross validation on the initial model based on the training sample set corresponding to the new energy station and each optimized hyperparameter to be validated, to complete the training of the initial model.

In an embodiment, the training module 21 is further configured to: input a validation sample set corresponding to the new energy station into each trained initial model, to obtain a validated output power output by each trained initial model; determine, based on an actual output power corresponding to a validation sample in the validation sample set and the validated output power output by each trained initial model, a prediction accuracy of each trained initial model; and select the optional power prediction model corresponding to the new energy station, from trained initial models.

The above-mentioned device for automatic machine learning-based prediction of new energy power with cloud-edge collaboration can be realized in whole or in part through software, hardware and their combinations. Each of the above modules may be embedded in or independent of the processor of the computer device in the form of hardware, or may be stored in the memory of the computer device in the form of software, so that the processor can call and execute the operations corresponding to the above modules.

Figure 23:
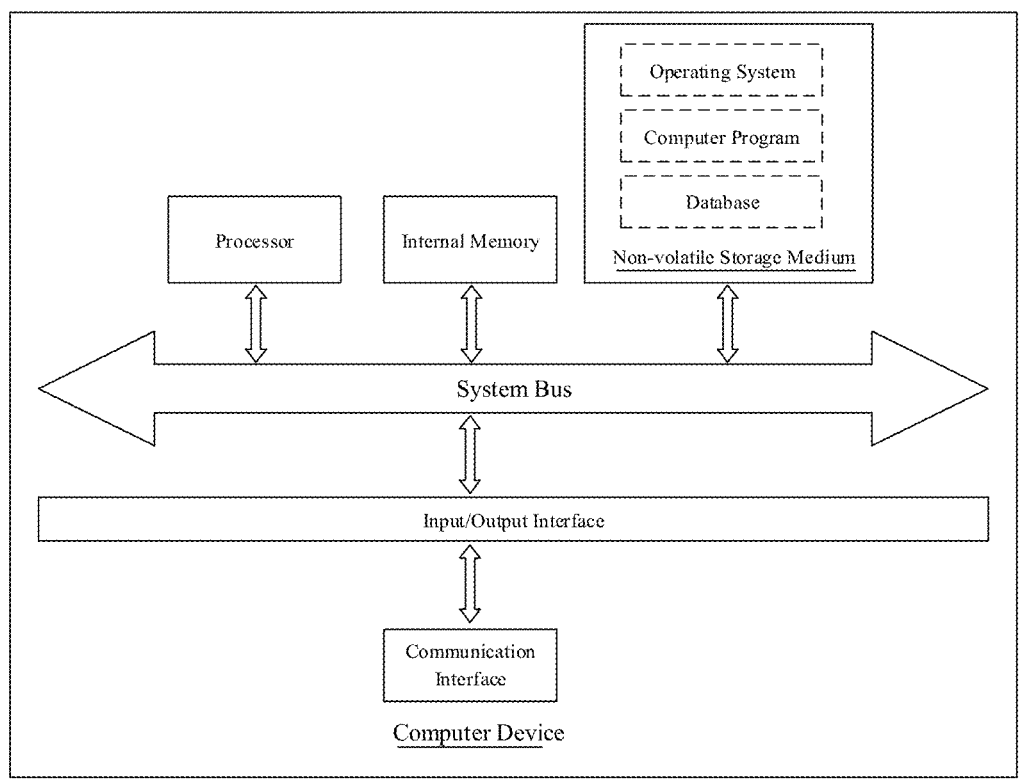
FIG. 23 is a diagram illustrating an internal structure of a computer device in an embodiment.

In an embodiment, a computer device is provided. The computer device may be a server, and may have an internal structure as shown in FIG. 23. The computer device includes a processor, a memory, and a network interface connected through a system bus. The processor of the computer device is used to provide computing and control capabilities. The memory of the computer device includes non-volatile storage media and internal memory. The non-volatile storage medium stores operating systems, computer programs and databases. This internal memory provides an environment for the execution of operating systems and computer programs in non-volatile storage media. The database of the computer device is used to store data for the new energy power cloud-edge collaboration prediction method of automatic machine learning. The network interface of the computer device is used to communicate with external terminals through a network connection. The computer program is executed by a processor to implement the method for automatic machine learning-based prediction of new energy power with cloud-edge collaboration.

Those skilled in the art can understand that the structure shown in FIG. 23 is only a block diagram of a partial structure related to the solution of the present disclosure, and does not constitute a limitation on the computer device to which the solution of the present disclosure is applied. A specific computer device can include more or fewer parts than shown, or combine certain parts, or have a different arrangement of parts.

In an embodiment, a computer device including a memory and a processor is provided. The computer program is stored in the memory. When the processor executes the computer program, it implements steps of: obtaining, in response to a power prediction demand for a target new energy station, future numerical weather prediction data of the target new energy station in a future period and historical output power of a historical period corresponding to the future period; selecting, based on missing of the future numerical weather prediction data and a data amount of the historical output power, a target power prediction model corresponding to the target new energy station from a set of power prediction models, each optional power prediction model in the set of power prediction models being trained and delivered by a cloud server based on an automatic machine learning algorithm; determining, based on the power prediction demand, a target working mode of the target power prediction model, the target working mode comprising a prediction business object, a prediction type, and a prediction time scale; and adjusting the target power prediction model according to the target working mode, and predicting, by the adjusted target power prediction model, a target output power of the target new energy station in the future period, based on the future numerical weather prediction data of the future period and the historical output power of the historical period corresponding to the future period.

In an embodiment, a computer-readable storage medium having a computer program stored thereon is provided. When the computer program is executed by a processor, the processor is caused to implement steps of: obtaining, in response to a power prediction demand for a target new energy station, future numerical weather prediction data of the target new energy station in a future period and historical output power of a historical period corresponding to the future period; selecting, based on missing of the future numerical weather prediction data and a data amount of the historical output power, a target power prediction model corresponding to the target new energy station from a set of power prediction models, each optional power prediction model in the set of power prediction models being trained and delivered by a cloud server based on an automatic machine learning algorithm; determining, based on the power prediction demand, a target working mode of the target power prediction model, the target working mode comprising a prediction business object, a prediction type, and a prediction time scale; and adjusting the target power prediction model according to the target working mode, and predicting, by the adjusted target power prediction model, a target output power of the target new energy station in the future period, based on the future numerical weather prediction data of the future period and the historical output power of the historical period corresponding to the future period.

In an embodiment, a computer device including a memory and a processor is provided. The computer program is stored in the memory. When the processor executes the computer program, it implements steps of: training, for each new energy station in a set of stations, each initial model based on a training sample set corresponding to the new energy station, and selecting an optional power prediction model corresponding to the new energy station from trained initial models, the training sample set comprising sample weather prediction data and sample output power, and different initial models being constructed based on different algorithms; constructing, based on the optional power prediction model corresponding to each new energy station, a set of power prediction models, wherein the set of power prediction models is configured for an edge server to: select a target power prediction model corresponding to a target new energy station, based on missing of future numerical weather prediction data of the target new energy station in a future period and a data amount of historical output power of the target new energy station in a historical period corresponding to the future period; and adjust the target power prediction model in a target working mode, and predict, by the adjusted target power prediction model, a target output power of the target new energy station in the future period based on the future numerical weather prediction data of the future period and the historical output power of the historical period corresponding to the future period; and delivering the set of power prediction models to the edge server.

In an embodiment, a computer-readable storage medium having a computer program stored thereon is provided. When the computer program is executed by a processor, the processor is caused to implement steps of: training, for each new energy station in a set of stations, each initial model based on a training sample set corresponding to the new energy station, and selecting an optional power prediction model corresponding to the new energy station from trained initial models, the training sample set comprising sample weather prediction data and sample output power, and different initial models being constructed based on different algorithms; constructing, based on the optional power prediction model corresponding to each new energy station, a set of power prediction models, wherein the set of power prediction models is configured for an edge server to: select a target power prediction model corresponding to a target new energy station, based on missing of future numerical weather prediction data of the target new energy station in a future period and a data amount of historical output power of the target new energy station in a historical period corresponding to the future period; and adjust the target power prediction model in a target working mode, and predict, by the adjusted target power prediction model, a target output power of the target new energy station in the future period based on the future numerical weather prediction data of the future period and the historical output power of the historical period corresponding to the future period; and delivering the set of power prediction models to the edge server.

Those of ordinary skill in the art can understand that all or part of the processes in the methods of the above embodiments can be completed by instructing relevant hardware through a computer program. The computer program can be stored in a non-volatile computer-readable storage. In the media, when executed, the computer program may include the processes of the above method embodiments. Any reference to memory, database or other media used in the embodiments provided in the present disclosure may include at least one of non-volatile and volatile memory. Non-volatile memory can include read-only memory (ROM), magnetic tape, floppy disk, flash memory, optical memory, high-density embedded non-volatile memory, resistive memory (ReRAM), magnetic variable memory (Magnetoresistive Random Access Memory (MRAM), ferroelectric memory (Ferroelectric Random Access Memory (FRAM)), phase change memory (Phase Change Memory (PCM)), graphene memory, etc. Volatile memory may include random access memory (Random Access Memory, RAM) or external cache memory, etc. By way of illustration and not limitation, RAM can be in many forms, such as static random access memory (Static Random Access Memory, SRAM) or dynamic random access memory (Dynamic Random Access Memory, DRAM). The databases involved in the various embodiments provided in the present disclosure may include at least one of a relational database and a non-relational database. Non-relational databases may include blockchain-based distributed databases, etc., but are not limited thereto. The processors involved in the various embodiments provided in the present disclosure may be general-purpose processors, central processing units, graphics processors, digital signal processors, programmable logic devices, quantum computing-based data processing logic devices, etc., and are not limited to this.

The technical features of the above embodiments can be combined in any way. To simplify the description, not all possible combinations of the technical features in the above embodiments are described. However, as long as there is no contradiction in the combination of these technical features, all possible combinations should be used. It is considered to be within the scope of this manual.

The above-described embodiments only express several implementation modes of the present disclosure, and their descriptions are relatively specific and detailed, but should not be construed as limiting the patent scope of the present disclosure. It should be noted that, for those of ordinary skill in the art, several modifications and improvements can be made without departing from the concept of the present disclosure, and these all fall within the protection scope of the present disclosure. Therefore, the scope of protection of the present disclosure should be determined by the appended claims.

What is claimed is:

1. A method for automatic machine learning-based prediction of new energy power with cloud-edge collaboration, which is executed by an edge server, the method comprising:
   obtaining, in response to a power prediction demand for a target new energy station, future numerical weather prediction data of the target new energy station in a future period and historical output power of a historical period corresponding to the future period;
   selecting, based on missing of the future numerical weather prediction data and a data amount of the historical output power, a target power prediction model corresponding to the target new energy station from a set of power prediction models, each optional power prediction model in the set of power prediction models being trained and delivered by a cloud server based on an automatic machine learning algorithm;

determining, based on the power prediction demand, a target working mode of the target power prediction model, the target working mode comprising a prediction business object, a prediction type, and a prediction time scale; and adjusting the target power prediction model according to the target working mode, and predicting, by the adjusted target power prediction model, a target output power of the target new energy station in the future period, based on the future numerical weather prediction data of the future period and the historical output power of the historical period corresponding to the future period.

2. The method according to claim 1, wherein selecting, based on the missing of the future numerical weather prediction data and the data amount of the historical output power, the target power prediction model corresponding to the target new energy station from the set of power prediction models comprises:

determining, when the target new energy station is identified as a non-newly built station or non-expanded station based on the amount data of the historical output power, a data missing level of the future numerical weather prediction data based on the missing of the future numerical weather prediction data; and selecting, based on the data missing level, the target power prediction model from the optional power prediction models pertaining to the target new energy station in the set of power prediction models.

3. The method according to claim 2, wherein predicting, by the adjusted target power prediction model, the target output power of the target new energy station in the future period, based on the future numerical weather prediction data of the future period and the historical output power of the historical period corresponding to the future period, comprises:

complementing, if the data missing level is a scattered missing level, missing data in the future numerical weather prediction data, and predicting, by the adjusted target power prediction model, the target output power of the target new energy station in the future period, based on the historical output power and the complemented future numerical weather prediction data; and predicting, by the adjusted target power prediction model, the target output power of the target new energy station in the future period, based on the historical output power, if the data missing level is a continuous missing level.

4. The method according to claim 1, wherein selecting, based on the missing of the future numerical weather prediction data and the data amount of the historical output power, the target power prediction model corresponding to the target new energy station from the set of power prediction models, comprises:

determining, when the target new energy station is identified as a newly built station or a newly expanded station based on the data amount of the historical output power, a data missing level of the future numerical weather prediction data based on the missing of the future numerical weather prediction data;

selecting, based on basic information of the target new energy station, a similar station whose similarity to the target new energy station reaches a similarity threshold from other new energy stations, the other new energy stations being stations in a set of stations except the target new energy station; and selecting, based on the data missing level, the target power prediction model corresponding to the target new energy station from the optional power prediction models pertaining to the similar station in the set of power prediction models.

5. The method according to claim 3, wherein selecting, based on the basic information of the target new energy station, the similar station whose similarity to the target new energy station reaches the similarity threshold from other new energy stations, comprises:

obtaining the basic information of the target new energy station and the basic information of each of the other new energy stations, the basic information comprising at least one dimension data selected from a group consisting of longitude and latitude data, capacity data, terrain data, landform data and altitude data;

determining, based on the basic information of the target new energy station and the basic information of each of the other new energy stations, a value of similarity between the target new energy station and each of the other new energy stations in each dimension data; and selecting, based on the value of similarity between the target new energy station and each of the other new energy stations in each dimension data, the similar station whose similarity to the target new energy station reaches the similarity threshold from the other new energy stations.

6. The method according to claim 1, wherein predicting, by the adjusted target power prediction model, the target output power of the target new energy station in the future period, based on the future numerical weather prediction data of the future period and the historical output power of the historical period corresponding to the future period comprises:

obtaining, if a station type of the target new energy station is a distributed new energy source, a grid position of the target new energy station; and predicting, by the adjusted target power prediction model, the target output power of the target new energy station in the future period, based on the historical output power and the future numerical weather prediction data corresponding to the grid position.

7. A computer device comprising a memory and a processor, wherein the memory stores a computer program, and the processor executes the computer program to implement the steps of the method of claim 1.

8. One or more non-transitory processor readable storage devices comprising a computer program stored thereon, the computer program, when executed by a processor, causing the processor to implement the steps of the method of claim 1.

9. A method for automatic machine learning-based prediction of new energy power with cloud-edge collaboration, which is executed by a cloud server, the method comprising:

training, for each new energy station in a set of stations, each initial model based on a training sample set corresponding to the new energy station, and selecting an optional power prediction model corresponding to the new energy station from trained initial models, the training sample set comprising sample weather prediction data and sample output power, and different initial models being constructed based on different algorithms;

constructing, based on the optional power prediction model corresponding to each new energy station, a set of power prediction models, wherein the set of power prediction models is configured for an edge server to:
select a target power prediction model corresponding to a target new energy station, based on missing of future numerical weather prediction data of the target new energy station in a future period and a data amount of historical output power of the target new energy station in a historical period corresponding to the future period; and
adjust the target power prediction model in a target working mode, and predict, by the adjusted target power prediction model, a target output power of the target new energy station in the future period based on the future numerical weather prediction data of the future period and the historical output power of the historical period corresponding to the future period; and
delivering the set of power prediction models to the edge server.

10. The method according to claim 9, wherein training each initial model based on the training sample set corresponding to the new energy station comprises:
performing data mining processing on original weather data in original data corresponding to the new energy station to obtain the sample weather prediction data in the training sample set;
performing multi-stage noise reduction processing on original output power in the original data to obtain the sample output power in the training sample set; and
training each initial model based on the training sample set.

11. The method according to claim 10, wherein performing the data mining processing on the original weather data in the original data corresponding to the new energy station to obtain the sample weather prediction data in the training sample set comprises:
performing data cleaning on the original weather data in the original data based on a slicing technology;
performing correlation analysis on the original output power and the cleaned original weather data to determine a principal component feature set in the original weather data;
validating validity of the principal component feature set to obtain a valid feature set; and
using the valid feature set as the sample weather prediction data in the training sample set.

12. The method according to claim 9, wherein training each initial model based on the training sample set corresponding to the new energy station comprises:
obtaining, for any initial model, a hyperparameter initial space and an initial step length corresponding to the initial model;
adjusting the initial step length based on the number of iterations;
searching for a hyperparameter optimization space within the hyperparameter initial space, based on the adjusted step length;
obtaining, based on a hyperparameter initial value and a Bayesian optimization algorithm, at least one optimized hyperparameter to be validated within the hyperparameter optimization space; and
performing, based on the training sample set corresponding to the new energy station and each optimized hyperparameter to be validated, k-fold cross validation on the initial model to complete the training of the initial model.

13. The method according to claim 9, wherein selecting the optional power prediction model corresponding to the new energy station from trained initial models comprising:
inputting a validation sample set corresponding to the new energy station into each trained initial model, to obtain a validated output power output by each trained initial model;
determining, based on an actual output power corresponding to a validation sample in the validation sample set and the validated output power output by each trained initial model, a prediction accuracy of each trained initial model; and
selecting, based on the prediction accuracy, the optional power prediction model corresponding to the new energy station from trained initial models.

14. A computer device comprising a memory and a processor, wherein the memory stores a computer program, and the processor executes the computer program to implement the steps of the method of claim 9.

15. One or more non-transitory processor readable storage devices comprising a computer program stored thereon, the computer program, when executed by a processor, causing the processor to implement the steps of the method of claim 9.

16. A device for automatic machine learning-based prediction of new energy power with cloud-edge collaboration, the device comprising:
a response module configured to obtain, in respond to a power prediction demand for a target new energy station, future numerical weather prediction data of the target new energy station in a future period and historical output power of a historical period corresponding to the future period;
a selection module configured to select, based on missing of the future numerical weather prediction data and a data amount of the historical output power, a target power prediction model corresponding to the target new energy station from a set of power prediction models, each optional power prediction model in the set of power prediction models being trained and delivered by a cloud server based on an automatic machine learning algorithm;
an adjustment module configured to determine, based on the power prediction demand, a target working mode of the target power prediction model, the target working mode comprising a prediction business object, a prediction type, and a prediction time scale; and
a prediction module configured to:
adjust the target power prediction model according to the target working mode; and
predict, by the adjusted target power prediction model, a target output power of the target new energy station in the future period, based on the future numerical weather prediction data and the historical output power.

17. A device for automatic machine learning-based prediction of new energy power with cloud-edge collaboration, the device comprising:
a training module configured to:
train, for each new energy station in a set of stations, each initial model based on a training sample set corresponding to the new energy station, and
select an optional power prediction model corresponding to the new energy station from trained initial models, the training sample set comprising sample weather prediction data and sample output power, and different initial models being constructed based on different algorithms;

a constructing module configured to construct, based on the optional power prediction model corresponding to each new energy station, a set of power prediction models, wherein the set of power prediction models is configured for an edge server to:

select a target power prediction model corresponding to the target new energy station, based on missing of future numerical weather prediction data of the target new energy station in the future period and a data amount of the historical output power of the target new energy station in the historical period corresponding to the future period; and adjust the target power prediction model in a target working mode, and predict, by the adjusted target power prediction model, a target output power of the target new energy station in the future period based on the future numerical weather prediction data of the future period and the historical output power of the historical period corresponding to the future period; and a delivery module configured to deliver the set of power prediction models to the edge server.

18. A system for automatic machine learning-based prediction of new energy power with cloud-edge collaboration, the system comprising:

a cloud server configured to:

train, for each new energy station in a set of stations, each initial model based on a training sample set corresponding to the new energy station;

select an optional power prediction model corresponding to the new energy station from trained initial models, the training sample set comprising sample weather prediction data and sample output power, and different initial models being constructed based on different algorithms;

construct, based on the optional power prediction model corresponding to each new energy station, a set of power prediction models; and deliver the set of power prediction models to the edge server; and an edge server configured to:

receive the set of power prediction models;

obtain, in response to a power prediction demand for a target new energy station, future numerical weather prediction data of the target new energy station in a future period and historical output power of a historical period corresponding to the future period, select, based on missing of the future numerical weather prediction data and a data amount of the historical output power, a target power prediction model corresponding to the target new energy station from a set of power prediction models, each optional power prediction model in the set of power prediction models being trained and delivered by the cloud server based on an automatic machine learning algorithm;

determine, based on the power prediction demand, a target working mode of the target power prediction model, the target working mode comprising a prediction business object, a prediction type, and a prediction time scale; and adjust the target power prediction model according to the target working mode, and predict, by the adjusted target power prediction model, a target output power of the target new energy station in the future period, based on the future numerical weather prediction data and the historical output power.

\* \* \* \* \*